US012196807B2

(12) United States Patent
Zhou et al.

(10) Patent No.: US 12,196,807 B2
(45) Date of Patent: Jan. 14, 2025

(54) NEAR FIELD WIRELESS COMMUNICATION SYSTEM FOR MOTHER TO PACKAGE AND PACKAGE TO PACKAGE SIDEBAND DIGITAL COMMUNICATION

(71) Applicant: Intel Corporation, Santa Clara, CA (US)

(72) Inventors: Zhen Zhou, Chandler, AZ (US); Renzhi Liu, Portland, OR (US); Jong-Ru Guo, Portland, OR (US); Kenneth P. Foust, Beaverton, OR (US); Jason A. Mix, Portland, OR (US); Kai Xiao, Portland, OR (US); Zuoguo Wu, San Jose, CA (US); Daqiao Du, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 872 days.

(21) Appl. No.: 17/133,659

(22) Filed: Dec. 24, 2020

(65) Prior Publication Data

US 2022/0206064 A1    Jun. 30, 2022

(51) Int. Cl.
  *G01R 31/302* (2006.01)
  *G01R 31/28* (2006.01)
  (Continued)

(52) U.S. Cl.
  CPC ..... *G01R 31/3025* (2013.01); *G01R 31/2896* (2013.01); *G01R 31/303* (2013.01);
  (Continued)

(58) Field of Classification Search
  CPC ............ G01R 31/3025; G01R 31/2896; G01R 31/303; G01R 31/2884; H01P 3/08; H01Q 9/16; H04B 5/48
  (Continued)

(56) References Cited

U.S. PATENT DOCUMENTS

| 2002/0040466 A1* | 4/2002 | Khazei | G06F 30/367 |
| | | | 716/115 |
| 2014/0152337 A1* | 6/2014 | Ding | G01R 31/2644 |
| | | | 438/11 |

(Continued)

FOREIGN PATENT DOCUMENTS

| CN | 101061640 A * | 10/2007 | ............... H04B 1/30 |
| WO | WO-2006019989 A2 * | 2/2006 | ............. E21B 19/10 |

OTHER PUBLICATIONS

Euopean Search Report issued for the corresponding European patent application No. 21195535.6, dated Jul. 5, 2022, 17 pages (for informational purposes only).

(Continued)

*Primary Examiner* — Tung X Nguyen
*Assistant Examiner* — Robert P Alejnikov, Jr.
(74) *Attorney, Agent, or Firm* — Viering, Jentschura & Partner mbB; Samuel Y. Lo

(57) ABSTRACT

A package substrate may include a circuit and a leaky surface wave launcher. The circuit may perform engineering tests and end-user operations using sideband signals. The leaky surface wave launcher may perform near field wireless communication. The leaky surface wave launcher may include a via and a strip line. The via may be electrically coupled to the circuit. The via may provide the sideband signals to and receive the sideband signals from the circuit. The strip line may be electrically coupled to the via. The strip line may be excited by the sideband signals to wirelessly couple the leaky surface wave launcher with an external device. The strip line and the via may be unbalanced such that the strip line generates a leaky wave that propagates at least a portion of the package substrate and an environment proximate the package substrate.

18 Claims, 14 Drawing Sheets

(51) Int. Cl.
G01R 31/303 (2006.01)
H01P 3/08 (2006.01)
H01Q 9/16 (2006.01)
H04B 5/48 (2024.01)

(52) U.S. Cl.
CPC ............... *H01P 3/08* (2013.01); *H01Q 9/16* (2013.01); *H04B 5/48* (2024.01)

(58) Field of Classification Search
USPC .................................................. 324/754.31
See application file for complete search history.

(56) References Cited

U.S. PATENT DOCUMENTS

2015/0168486 A1* 6/2015 Isaac .................. G01R 31/2822 324/756.02
2016/0266187 A1* 9/2016 Kawano ............. G01R 31/2822
2018/0003764 A1* 1/2018 Menon .................... H04W 4/80

OTHER PUBLICATIONS

The partial European search report for European Patent Application No. 21195535.6, dated Mar. 18, 2022, 14 pages (For reference purposes only).

Miura, Noriyuki et al., "An 11Gb/s Inductive-Coupling Link with Burst Transmission", ISSCC 2008, Feb. 5, 2008, 3 pages, TD: Trends in Signal and Power Transmission, 2008 IEEE International Solid-State Circuits Conference—Digest of Technical Papers, Session 15.

Harrington, Roger F., "Time-Harmonic Electromagnetic Fields", Chapter 4: "Plane Wave Functions", John Wiley & Sons Ltd, 2001, pp. 143-197.

* cited by examiner

NEAR FIELD WIRELESS COMMUNICATION SYSTEM FOR MOTHER TO PACKAGE AND PACKAGE TO PACKAGE SIDEBAND DIGITAL COMMUNICATION

TECHNICAL FIELD

The aspects discussed in the present disclosure are related to near field wireless communication system for mother to package and package to package sideband digital communication.

BACKGROUND

Unless otherwise indicated in the present disclosure, the materials described in the present disclosure are not prior art to the claims in the present application and are not admitted to be prior art by inclusion in this section.

To verify proper operation of a chip (e.g., a circuit under test) physically positioned within a package, the chip may undergo various design verification tests, production verification tests, or some combination thereof. The engineering tests may be performed to verify an initial design of the chip. The production verification test may be performed to verify proper manufacturing of the chip. To perform the engineering tests and the production verification tests, the chip may receive sideband signals from and transmit sideband signals to an external device. The chip may use the sideband signals to operate various components within the chip. In addition, the external device may measure characteristics of the sideband signals to determine whether the chip is operating properly.

The subject matter claimed in the present disclosure is not limited to aspects that solve any disadvantages or that operate only in environments such as those described above. Rather, this background is only provided to illustrate one example technology area where some aspects described in the present disclosure may be practiced.

BRIEF DESCRIPTION OF THE DRAWINGS

Example aspects will be described and explained with additional specificity and detail through the use of the accompanying drawings in which.

DETAILED DESCRIPTION

Figure 1:
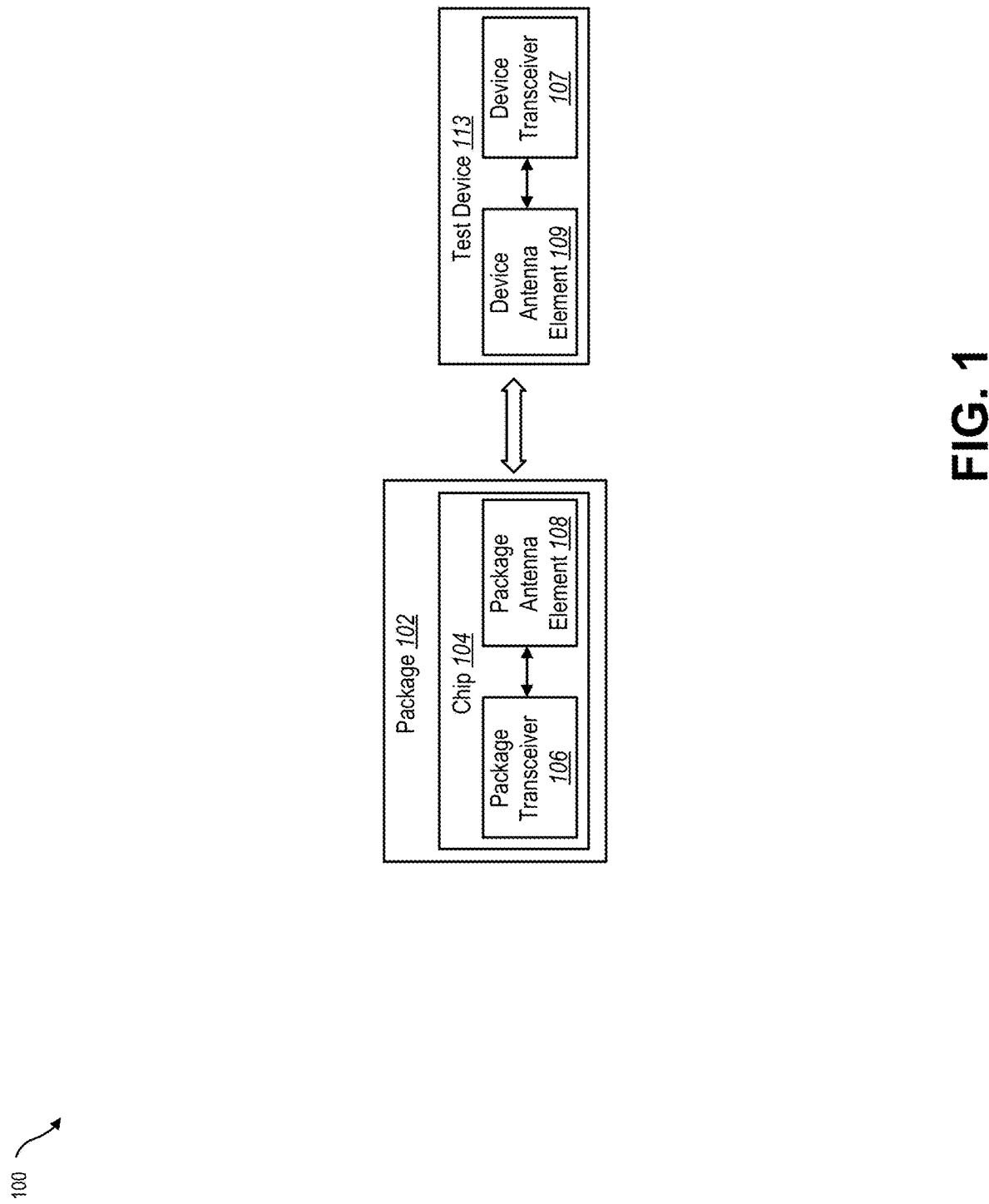
FIG. 1 illustrates a block diagram of an example environment to perform verification tests.

The following detailed description refers to the accompanying drawings that show, by way of illustration, exemplary details in which aspects of the present disclosure may be practiced.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

A wafer may include one or more chips (e.g., circuits). The wafer may be designed to be diced to form multiple packages (e.g., package substrates) that each include at least one chip. An instance of a single package and a single chip are discussed in the present disclosure for simplicity of discussion. The operations described in the present disclosure may be performed using multiple packages, multiple chips, or some combination thereof without departing from the scope or the spirit of the present disclosure.

The chip may undergo design verification tests, production verification tests, or some combination thereof (generally referred to in the present disclosure as verification tests). For example, the chip may undergo engineering verification tests to verify proper initial design and end-user operations (e.g., design verification tests) of the chip. In some aspects, the design verification tests may include debugging operations, control operations, testing operations, or some combination thereof. As another example, the chip may undergo high volume HVM verification tests (e.g., production verification tests) to verify proper manufacturing of the chip. In some aspects, the production verification tests may include control operations, testing operations, or some combination thereof.

The chip may be coupled to a test device to perform the verification tests. In some aspects, the test device may include an external device, a mother board, or some combination thereof. The chip may transmit sideband signals to and receive sideband signals from the test device. The chip and the test device may use the sideband signals to perform the verification tests. In some aspects, the chip may use the sideband signals to operate various components within the chip. In addition, the test device may measure various characteristics of the sideband signals received from the chip to determine whether the chip is operating properly. In some aspects, the chip may use the sideband signals during post production operation of the chip.

As chip design and chip manufacturing capabilities increase, functionalities of the chip may also increase. Correspondingly, as the functionalities of the chip increase, a number of input/outputs (I/Os) within the chip, sideband signals that are used to perform the verification tests or operation of the chip, or some combination thereof may also increase. Further, as the number of sideband signals increase, a number of pins within the package substrate, the chip, or some combination thereof dedicated to the sideband signals may also increase. A greater number of sideband signals may also cause a number of pins within the test device to increase.

In addition, a greater number of sideband signals may cause routing congestion of traces and the pins within the package, the test device, or some combination thereof. Further, a greater number of sideband signals may cause a circuit footprint of the chip to increase, which may increase a production cost of the package, an overall size of the package, or some combination thereof.

Some testing technologies may couple the package (e.g., the chip) to the test device using a grid array (e.g., a land grid array (LGA), a ball grid array (BGA), or some combination thereof). Some testing technologies may include cable connectors (e.g., a type N connector, a DIN connector, a sub miniature version A (SMA) connector, etc.) and a cable to couple the package (e.g., the chip) to the test device. These testing technologies may create an impedance mismatch between the test device and the package. In addition, these testing technologies may include various components to compensate for the impedance mismatch, which may increase a design complexity, design cost, production cost, circuit footprint, or some combination thereof of the package and the test device.

Some testing technologies may include inductors within the package and the test device to wirelessly couple the package to the test device. These testing technologies may include a limited range of the wireless coupling. For example, these testing technologies may include a range of less than one millimeter (mm).

Some aspects described in the present disclosure may couple the package (e.g., the chip) to the test device without causing the impedance mismatch. In addition, some aspects described in the present disclosure may be capable of wirelessly coupling the test device to the package at greater distances than inductors.

In some aspects, the package substrate may include a package antenna element configured as a leaky surface wave launcher. In these and other aspects, the test device may include a device antenna element that is also configured as a leaky surface wave launcher. The package antenna element and the device antenna element are generally referred to in the present disclosure as antenna elements. The antenna elements may each include an unbalanced via and a microstrip line (e.g., a strip line). The unbalanced via and the strip line may be excited in predominantly spherical transverse electric (TE) mode or transverse magnetic (TM) mode to perform near field communication (NFC) coupling. For example, the antenna elements may perform NFC coupling to wirelessly couple the package to the test device.

In addition, the package may include a package transceiver and the test device may include a device transceiver. The package transceiver and the device transceiver are generally referred to in the present disclosure as transceivers. The transceivers may directly apply digital signals as switching signals to modulate carrier signals. In some aspects, the carrier signals may be generated by voltage controlled oscillators. In addition, the transceivers may directly down convert received sideband signals to digital signals using filters and data samplers.

A package (e.g., a package substrate) may include a chip (e.g., a circuit) and a leaky surface wave launcher. The chip may perform engineering tests and end-user operations using sideband signals. The leaky surface wave launcher may perform NFC coupling between the package and a test device (e.g., an external device). In some aspects, the leaky surface wave launcher may include a monopole leaky surface wave launcher. The leaky surface wave launcher may include a via and a strip line. The via may be electrically coupled to the chip. The strip line may be electrically coupled to the via. The via may provide the sideband signals to and receive the sideband signals from the chip. The strip line may be excited by the sideband signals to generate a leaky wave that wirelessly couples the leaky surface wave launcher to the test device. In some aspects, the strip line and the via may be unbalanced to cause the strip line to generate the leaky wave. The leaky wave may propagate at least a portion of the package substrate and an environment proximate the package substrate to perform the NFC coupling.

In some aspects, the leaky surface wave launcher may include a dipole leaky surface wave launcher. The leaky surface wave launcher may include a first via, a second via, a first strip line, and a second strip line. The first via and the second via may be electrically coupled to the chip. The first via may be electrically coupled to the first strip line. The second via may be electrically coupled to the second strip line. The first via may provide a negative portion of the sideband signals to and receive the negative portion of the sideband signals from the chip. The first strip line may be excited by the negative portion of the sideband signals. The second via may provide a positive portion of the sideband signals to and receive the positive portion of the sideband signals from the chip. The second strip line may be excited by the positive portion of the sideband signals. In some aspects, the first strip line may be excited by the negative portion and the second strip line may be excited by the positive portion to generate the leaky wave to perform the NFC coupling with the external device.

A probe for wireless lab testing may include a leaky surface wave launcher and a transceiver. The transceiver may be electrically coupled to the leaky surface wave launcher. The leaky surface wave launcher may perform NFC coupling with a separate package that includes a chip (e.g., a circuit under test). The leaky surface wave launcher may wirelessly provide the sideband signals to and wirelessly receive the sideband signals from the chip. The transceiver may process the sideband signals received by the leaky surface wave launcher. In addition, the transceiver may generate the sideband signals for wireless transmission by the leaky surface wave launcher. The probe may be configured to be placed physically proximate the chip to perform test operations of the chip. The probe may perform the test operations of the chip by wirelessly transmitting and receiving the sideband signals via the NFC coupling.

A HVM test system may include a test device that defines an opening configured to receive a package (e.g., a package under test). The test device may include an external access agent (EAA). The EAA may include a first leaky surface wave launcher and a first transceiver. The first transceiver may be electrically coupled to the first leaky surface wave launcher. The first leaky surface wave launcher may perform NFC coupling with the package. The package may include a silicon package agent (SPA). The first leaky surface wave launcher may wirelessly provide the sideband signals to and wirelessly receive the sideband signals from the SPA. The first transceiver may process the sideband signals received by the first leaky surface wave launcher. In addition, the first transceiver may generate the sideband signals for wireless transmission by the first leaky surface wave launcher.

A HVM test system may include a test socket, an EAA, and a mother board. The EAA may be physically positioned on a surface of the test socket. The test socket may define an opening configured to receive a package (e.g., a package under test). The test socket may include multiple vias. The vias may electrically couple the test socket to the package when the package is physically positioned within the opening. In some aspects, the package may include a chip (e.g., an integrated circuit (IC)). The EAA may include a first leaky surface wave launcher and a first transceiver. The first transceiver may be electrically coupled to the first leaky surface wave launcher. The first leaky surface wave launcher may perform NFC coupling with the package.

The first leaky surface wave launcher may wirelessly provide the sideband signals to and wirelessly receive the sideband signals from the chip. The first transceiver may process the sideband signals received by the first leaky surface wave launcher. In addition, the first transceiver may generate the sideband signals for wireless transmission by the first leaky surface wave launcher. The mother board may be electrically coupled to the EAA via a cable. The mother board may also be electrically coupled to each of the vias. The motherboard may provide the sideband signals to the EAA through the cable. In addition, the motherboard may provide the sideband signals to the package through the vias.

At least one aspect described in the present disclosure may include a leaky surface wave launcher that includes a smaller circuit footprint compared to inductors, grid arrays, or some combination thereof. For example, at least one aspect described in the present disclosure may reduce circuit complexity, circuit cost, circuit power consumption, or some combination thereof by reducing or eliminating the impedance mismatch between the package and the test device. In addition, at least one aspect described in the present disclosure may permit verification tests to be performed using wireless probes, test devices via NFC coupling, or some combination thereof. Further, at least one aspect described in the present disclosure may provide flexible communication schemes. For example, the flexible communication schemes may include broadcasting, multi-drop, or some combination thereof. At least one aspect described in the present disclosure may permit re-purposing of the sideband signals to operational functions of the chip.

These and other aspects of the present disclosure will be explained with reference to the accompanying figures. It is to be understood that the figures are diagrammatic and schematic representations of such example aspects, and are not limiting, nor are they necessarily drawn to scale. In the figures, features with like numbers indicate like structure and function unless described otherwise.

FIG. 1 illustrates a block diagram of an example environment 100 to perform verification tests, in accordance with at least one aspect described in the present disclosure. The environment 100 may include a package 102 and a test device 113. The package 102 may include a chip 104 (e.g., a chip under test). The chip 104 may include a package transceiver 106 and a package antenna element 108. The package transceiver 106 may be electrically coupled to the package antenna element 108. The test device 113 may include a device transceiver 107 and a device antenna element 109. The device transceiver 107 may be electrically coupled to the device antenna element 109. The package antenna element 108 and the device antenna element 109 may be wirelessly coupled via NFC coupling.

In some aspects, the package antenna element 108 and the device antenna element 109 may include a monopole antenna element (e.g., a monopole leaky surface wave launcher). In other aspects, the package antenna element 108 and the device antenna element 109 may include a dipole antenna element (e.g., a dipole leaky surface wave launcher).

In some aspects, the device transceiver 107 and the package transceiver 106 may each include a transmitter, a receiver, a receive chain, a transmit chain, or some combination thereof. In these and other aspects, the package transceiver 106 may be electrically coupled between a portion of the chip 104 and the package antenna element 108. In addition, the device transceiver 107 may be electrically coupled between a portion of the test device 113 and the device antenna element 109.

The package antenna element 108 and the device antenna element 109 may wirelessly transmit and wirelessly receive sideband signals. The device transceiver 107 may generate the sideband signals to be transmitted by the device antenna element 109. In addition, the device transceiver 107 may process the sideband signals received by the device antenna element 109. The package transceiver 106 may generate the sideband signals to be transmitted by the package antenna element 108. In addition, the package transceiver 106 may process the sideband signals received by the package antenna element 108. The sideband signals may be used by the chip 104 and the test device 113 to verify proper operation of the chip 104. For example, the sideband signals may cause the chip to undergo the verification tests.

Figure 2:
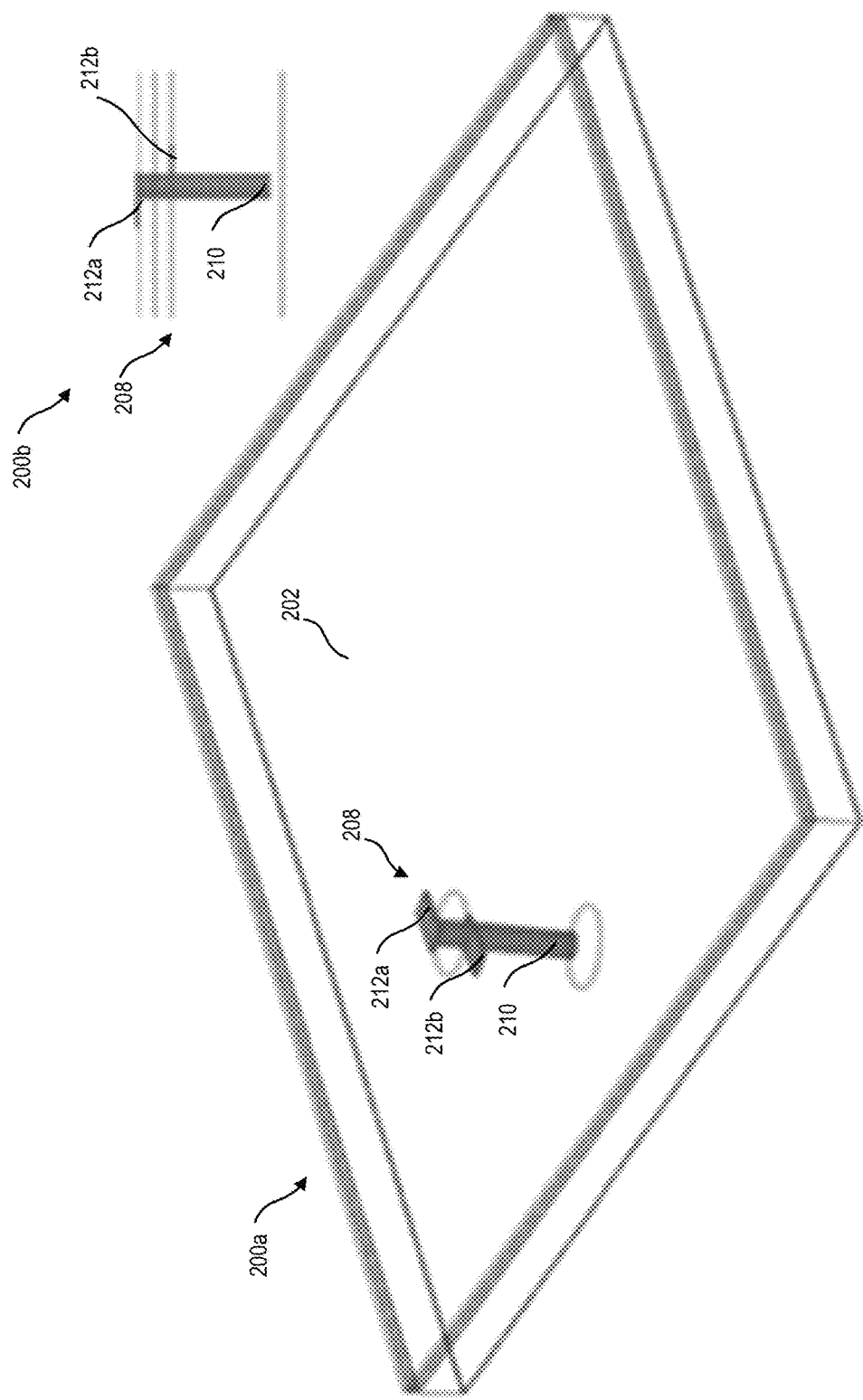
FIG. 2 illustrates an example package that includes a monopole leaky surface wave launcher.

FIG. 2 illustrates an example package 202 that includes a monopole leaky surface wave launcher 208, in accordance with at least one aspect described in the present disclosure. A perspective view 200a and a sectional view 200b of the package 202 are illustrated in FIG. 2. In some aspects, the package 202 may correspond to the package 102 of FIG. 1. In other aspects, the package 202 may correspond to the test device 113 of FIG. 1.

The monopole leaky surface wave launcher 208 may include a via 210, a first strip line 212a, and a second strip line 212b. The first strip line 212a and the second strip 212b may be electrically coupled to the via 210. The package 202 may include a circuit (not illustrated) electrically coupled to the via 210. The circuit may be configured to perform verification tests and end-user operations of the circuit using sideband signals. In addition, the circuit may include a transceiver. The monopole leaky surface wave launcher 208 may perform NFC coupling.

The package 202 may include multiple layers. One of the layers may include a ground layer. The via 210 may extend across one or more layers of the package 202. The first strip line 212a and the second strip line 212b may be physically positioned adjacent to different layers of the package 202. In some aspects, the first strip line 212a and the second strip line 212b may form an open stub. The ground layer may electrically ground the monopole leaky surface wave launcher 208. In some aspects, the monopole surface wave launcher 208 may include a monopole antenna element.

The first strip line 212a and the second strip line 212b may be excited by the sideband signals. The first strip line 212a and the second strip line 212b may be excited by the sideband signals to wirelessly couple the monopole leaky surface wave launcher 208 with an external device (e.g., the test device 113 of FIG. 1). In addition, the first strip line 212a and the second strip line 212b may be unbalanced with the via 210 to cause the first strip line 212a and the second strip line 212b to provide a leaky wave to at least a portion of the package 202 and an environment proximate to the package 202.

The via 210 may receive the sideband signals to be transmitted from the transceiver. The via 210 may provide the sideband signals to be transmitted to the first strip line 212a and the second strip line 212b. The first strip line 212a and the second strip line 212b may be excited by the sideband signals to be transmitted such that the leaky wave propagates a dielectric substrate of the package 202 and a portion of an environment surrounding the package 202. In some aspects, the leaky wave may propagate a portion of the dielectric that is physically proximate the ground layer. The monopole surface wave launcher 208 may radiate the leaky wave as a surface guided wave propagation.

The first strip line 212a and the second strip line 212b may be excited by the receive sideband signals. The first strip line 212a and the second strip line 212b may provide the receive sideband signals to the via 210. The via 210 may provide the receive sideband signals to the transceiver to process.

Figure 3:
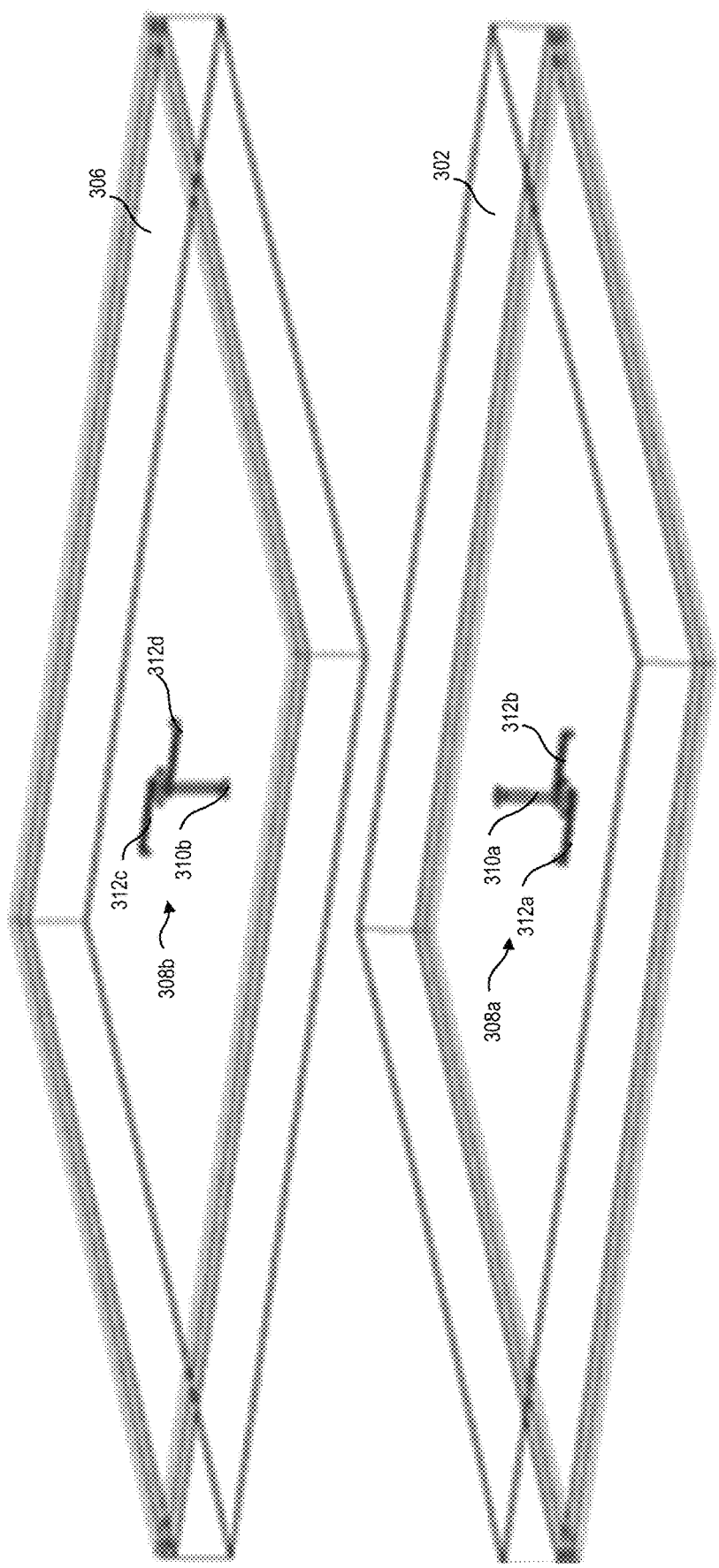
FIG. 3 illustrates example packages that include monopole leaky surface wave launchers to perform verification tests.

FIG. 3 illustrates example packages 302, 306 that include monopole leaky surface wave launchers 308a-b to perform verification tests, in accordance with at least one aspect described in the present disclosure. A first package 302 may include a first surface wave launcher 308a. A second package 306 may include a second surface wave launcher 308b. The first surface wave launcher 308a and the second surface wave launcher 308b may be the same as or similar to the monopole leaky surface wave launcher 208 of FIG. 2. The first package 302 may correspond to the package 102 of FIG. 1. The second package 306 may correspond to the test device 113 of FIG. 1.

The first leaky surface wave launcher 308a may include a first via 310a, a first strip line 312a, and a second strip line 312b. The first strip line 312a and the second strip line 312b may form a first open stub. The first strip line 312*a* and the second strip line 312*b* may be electrically coupled to the first via 310*a*. The first package 302 may include a transceiver (not illustrated) electrically coupled to the first via 310*a*.

The second leaky surface wave launcher 308*b* may include a second via 310*b* (e.g., a probe via), a third strip line 312*c*, and a fourth strip line 312*d*. The third strip line 312*c* and the fourth strip line 312*d* may form a probe strip line. The third strip line 312*a* and the fourth strip line 312*d* may form a second open stub. The third strip line 312*c* and the fourth strip line 312*d* may be electrically coupled to the second via 310*b*. The second package 306 may include a probe transceiver (not illustrated) electrically coupled to the second via 310*b*.

In some aspects, the first leaky surface wave launcher 308*a* may physically mirror the second leaky surface wave launcher 308*b*. For example, the first via 310*a* may extend in a direction away from the first strip line 312*a* and the second strip line 312*b* towards the second leaky surface wave launcher 308*b* and the second via 310*b* may extend in a direction away from the third strip line 312*c* and the fourth strip line 312*d* towards the first leaky surface wave launcher 308*a*.

The first monopole leaky surface wave launcher 308*a* and the second monopole leaky surface wave launcher 308*b* may operate the same as or similar to the monopole leaky surface wave launcher 208 of FIG. 2. The first monopole leaky surface wave launcher 308*a* may generate a first leaky wave that propagates at least a portion of the first package 302 and an environment proximate the first package 302. The first leaky wave may include the sideband signals. The second monopole leaky surface wave launcher 308*b* may generate a second leaky wave that propagates at least a portion of the second package 306 and an environment proximate the second package 306. The second leaky wave may include the sideband signals.

The first monopole leaky surface wave launcher 308*a* and the second monopole leaky surface wave launcher 308*b* may be physically positioned proximate each other to perform NFC coupling. The first monopole leaky surface wave launcher 308*a* may receive the second leaky wave. The second monopole leaky surface wave launcher 308*b* may receive the first leaky wave.

Figure 4:
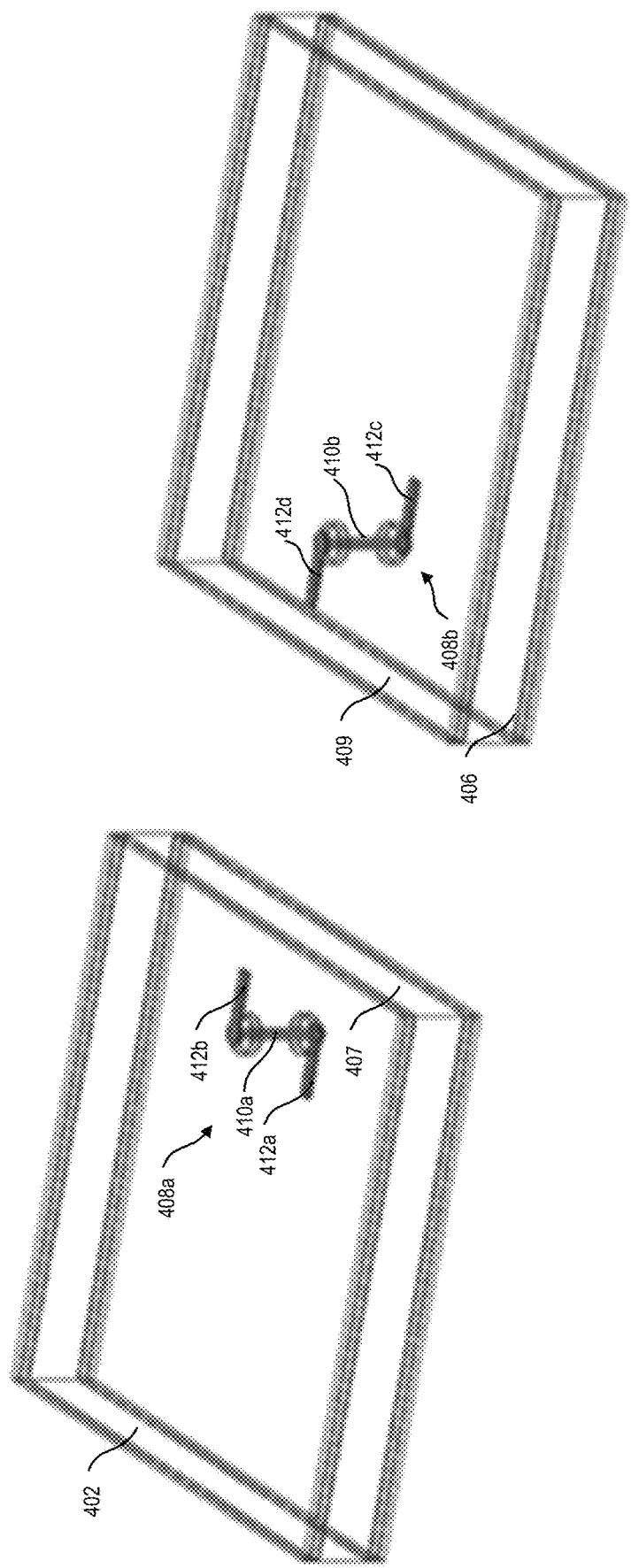
FIG. 4 illustrates example packages that include monopole leaky surface launchers to perform NFC coupling and verification tests via edges of the packages.

FIG. 4 illustrates example packages 402, 406 that include monopole leaky surface launchers 408*a-b* to perform NFC coupling and verification tests via edges 407, 409 of the packages 402, 406, in accordance with at least one aspect described in the present disclosure. A first package 402 may include a first surface wave launcher 408*a*. A second package 406 may include a second surface wave launcher 408*b*. The first surface wave launcher 408*a* and the second surface wave launcher 408*b* may be the same as or similar to the monopole leaky surface wave launcher 208 of FIG. 2. The first package 402 may correspond to the package 102 of FIG. 1. The second package 406 may correspond to the test device 113 of FIG. 1.

The first leaky surface wave launcher 408*a* may include a first via 410*a*, a first strip line 412*a*, and a second strip line 412*b*. The first strip line 412*a* and the second strip line 412*b* may form a first open stub. The first strip line 412*a* and the second strip line 412*b* may be electrically coupled to the first via 410*a*. The first package 402 may include a transceiver (not illustrated) electrically coupled to the first via 410*a*.

The second leaky surface wave launcher 408*b* may include a second via 410*b*, a third strip link 412*c*, and a fourth strip line 412*d*. The third strip line 412*c* and the fourth strip line 412*d* may form a probe strip line. The third strip line 412*a* and the fourth strip line 412*d* may form a second open stub. The third strip line 412*c* and the fourth strip line 412*d* may be electrically coupled to the second via 410*b*. The second package 406 may include a probe transceiver (not illustrated) electrically coupled to the second via 410*b*.

In some aspects, the first leaky surface wave launcher 408*a* may physically mirror the second leaky surface wave launcher 408*b*. For example, the first strip line 412*a* and the fourth strip line 412*d* may extend in a direction away from the first via 410*a* and the second via 410*b*, respectively and towards each other. As another example, the second strip line 412*b* and the third strip line 412*c* may extend in a direction away from the first via 410*a* and the second via 410*b*, respectively and away from each other.

The first monopole leaky surface wave launcher 408*a* and the second monopole leaky surface wave launcher 408*b* may operate similar to the monopole leaky surface wave launcher 208 of FIG. 2. The first monopole leaky surface wave launcher 408*a* may generate a first leaky wave that propagates at least a portion of the first package 402 and an environment proximate the first package 402. The first leaky wave may include the sideband signals. The second monopole leaky surface wave launcher 408*b* may generate a second leaky wave that propagates at least a portion of the second package 406 and an environment proximate the second package 406. The second leaky wave may include the sideband signals.

The first monopole leaky surface wave launcher 408*a* and the second monopole leaky surface wave launcher 408*b* may be physically positioned proximate an edge 407 of the first package 402 and an edge 409 of the second package 406, respectively. The first monopole leaky surface wave launcher 408*a* and the second monopole leaky surface wave launcher 408*b* may be physically positioned proximate each other to perform NFC coupling. The first monopole leaky surface wave launcher 408*a* may receive the second leaky wave. The second monopole leaky surface wave launcher 408*b* may receive the first leaky wave.

Figure 5:
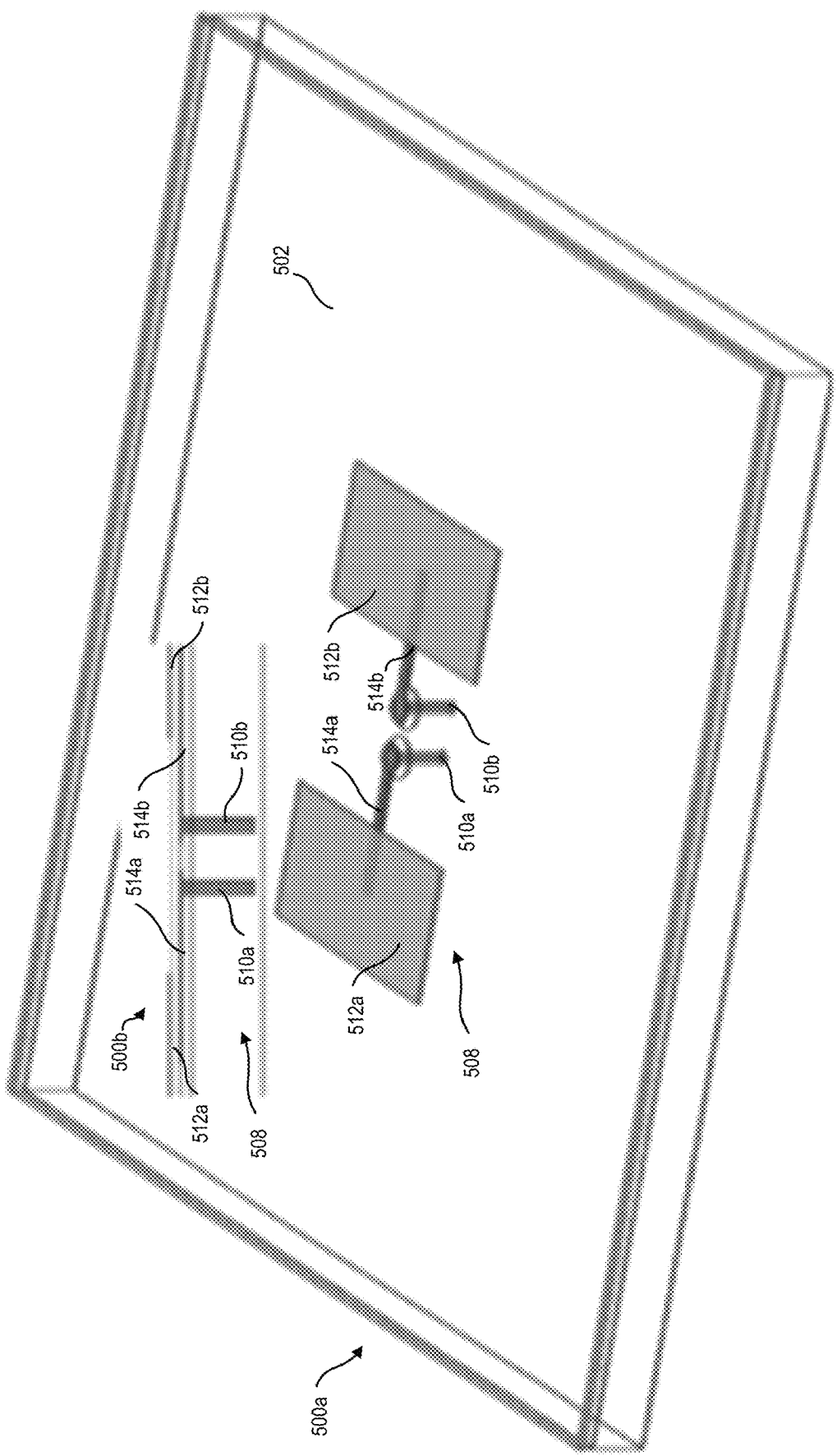
FIG. 5 illustrates an example package that includes a dipole leaky surface wave launcher.

FIG. 5 illustrates an example package 502 that includes a dipole leaky surface wave launcher 508, in accordance with at least one aspect described in the present disclosure. A perspective view 500*a* and a sectional view 500*b* of the package 502 are illustrated in FIG. 5. In some aspects, the package 502 may correspond to the package 102 of FIG. 1. In other aspects, the package 502 may correspond to the test device 113 of FIG. 1.

The dipole leaky surface wave launcher 508 may include a first via 510*a*, a second via 510*b*, a first plate 512*a*, a second plate 512*b*, a first strip line 514*a*, and a second strip line 514*b*. The first strip line 514*a* may electrically couple the first plate 512*a* to the first via 510*a*. The second strip line 514*b* may electrically couple the second plate 512*b* to the second via 510*b*. The package 502 may include a circuit (not illustrated) electrically coupled to the first via 510*a* and the second via 510*b*. The circuit may be configured to perform verification tests and end-user operations of the circuit using sideband signals. In addition, the circuit may include a transceiver. The dipole leaky surface wave launcher 508 may perform NFC coupling.

The package 502 may include multiple layers. One of the layers may include a ground layer. The first via 510*a* and the second via 510*b* may extend across one or more layers of the package 502. The first strip line 514*a*, the second strip line 514*b*, the first plate 512*a*, and the second plate 512*b* may be physically positioned adjacent the same layers of the package 502. In some aspects, the first strip line 514*a* and the second strip line 514*b* may form an open stub. In some aspects, the dipole surface wave launcher 508 may include a dipole antenna element.

The first plate 512*a* and the second plate 512*b* may be excited by the sideband signals. The first plate 512*a* and the second plate 512*b* may be excited by the sideband signals to wirelessly couple the dipole leaky surface wave launcher 508 with an external device (e.g., the test device 113 of FIG. 1). In addition, the first plate 512*a* and the second plate 512*b* may be unbalanced with the first via 510*a* and the second via 510*b*, respectively to cause the first plate 512*a* and the second plate 512*b* to provide a leaky wave to at least a portion of the package 502 and an environment proximate the package 502.

The first via 510*a* and the second via 510*b* may receive the sideband signals to be transmitted from the transceiver. In some aspects, the first via 510*a* may receive a positive portion of the sideband signals. In these and other aspects, the second via 510*b* may receive a negative portion of the sideband signals. The first via 510*a* may provide the positive portion of the sideband signals to the first strip line 514*a*. The second via 510*b* may provide the negative portion of the sideband signals to the second strip line 514*b*. The first strip line 514*a* may provide the positive portion of the sideband signals to the first plate 512*a*. The second strip line 514*b* may provide the negative portion of the sideband signals to the second plate 512*b*.

The first plate 512*a* may be excited by the positive portion of the sideband signals. The second plate 512*b* may be excited by the negative portion of the sideband signals. The first plate 512*a* and the second plate 512*b* may be excited by the sideband signals such that a leaky wave propagates a dielectric substrate of the package 502 and a portion of an environment surrounding the package 502. The dipole surface wave launcher 508 may radiate the leaky wave as a surface guided wave propagation.

The first plate 512*a* and the second plate 512*b* may be excited by the receive sideband signals. The first plate 512*a* may provide a positive portion of the receive sideband signals to the first strip line 514*a*. The second plate 512*b* may provide a negative portion of the receive sideband signals to the second strip line 514*b*. The first strip line 514*a* may provide the positive portion of the receive sideband signals to the first via 510*a*. The second strip line 514*b* may provide the negative portion of the receive sideband signals to the second via 510*b*. The first via 510*a* may provide the positive portion of the receive sideband signals to the transceiver to process. The second via 510*b* may provide the negative portion of the receive sideband signals to the transceiver to process.

Figure 6:
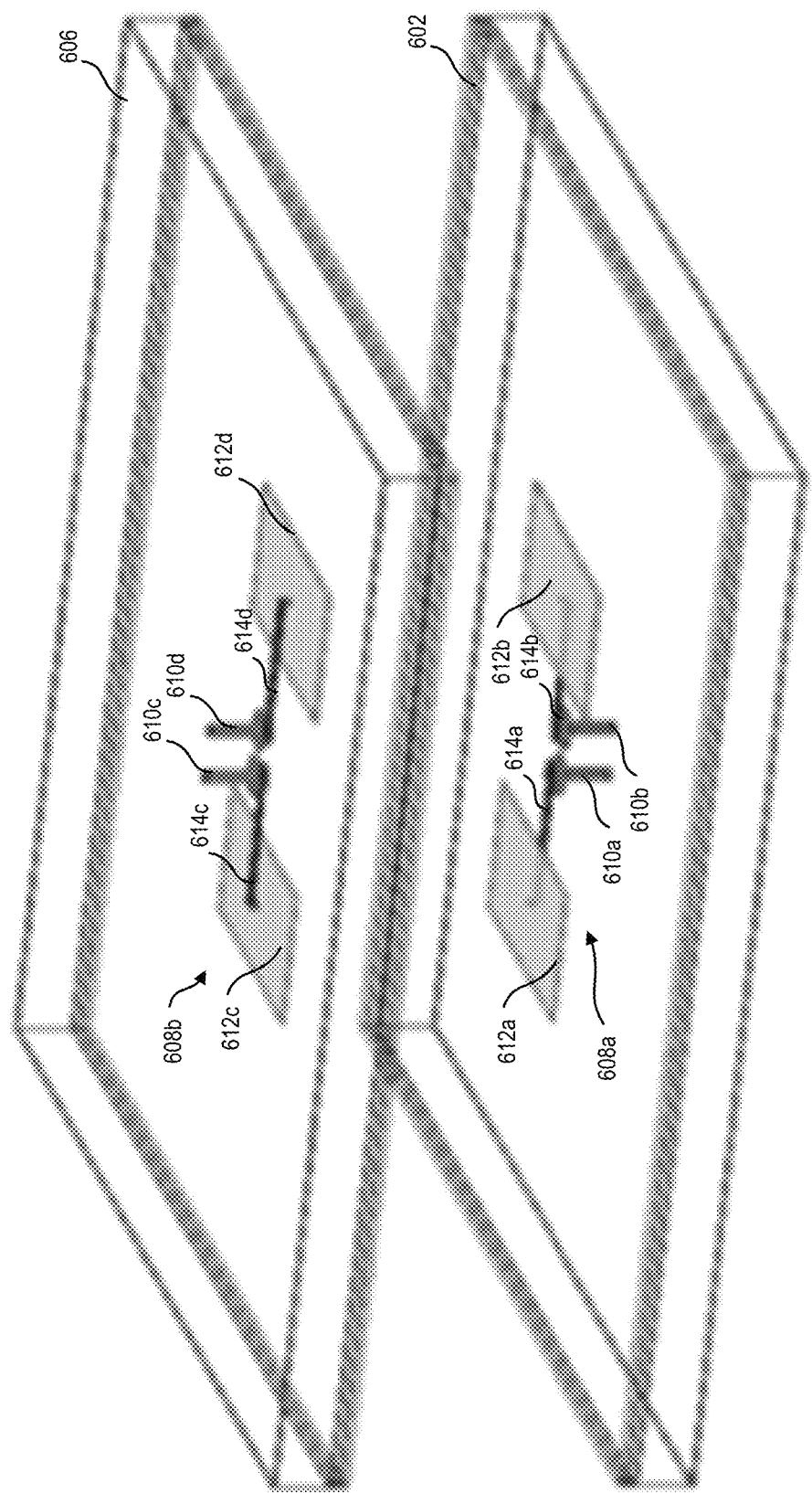
FIG. 6 illustrates example packages that include dipole leaky surface wave launcher to perform verification tests.

FIG. 6 illustrates example packages 602, 606 that include dipole leaky surface wave launcher 608*a*-*b* to perform verification tests, in accordance with at least one aspect described in the present disclosure. A first package 602 may include a first surface wave launcher 608*a*. A second package 606 may include a second surface wave launcher 608*b*. The first surface wave launcher 608*a* and the second surface wave launcher 608*b* may be the same as or similar to the dipole leaky surface wave launcher 508 of FIG. 5. The first package 602 may correspond to the package 102 of FIG. 1. The second package 606 may correspond to the test device 113 of FIG. 1.

The first leaky surface wave launcher 608*a* may include a first via 610*a*, a second via 610*b*, a first strip line 614*a*, a second strip line 614*b*, a first plate 612*a*, and a second plate 612*b*. The first strip line 614*a* may electrically couple the first plate 612*a* to the first via 610*a*. The second strip line 614*b* may electrically couple the second plate 612*b* to the second via 610*b*. The first package 602 may include a transceiver (not illustrated) electrically coupled to the first via 610*a* and the second via 610*b*.

The second leaky surface wave launcher 608*b* may include a third via 610*c*, a fourth via 610*d*, a third strip line 614*c*, a fourth strip line 614*d*, a third plate 612*c*, and a fourth plate 612*d*. The third strip line 614*c* may electrically couple the third plate 612*c* to the third via 610*c*. The fourth strip line 614*d* may electrically couple the fourth plate 612*d* to the fourth via 610*d*. The second package 606 may include a probe transceiver (not illustrated) electrically coupled to the third via 610*c* and the fourth via 610*d*.

In some aspects, the first leaky surface wave launcher 608*a* may physically mirror the second leaky surface wave launcher 608*b*. For example, the first via 610*a* and the second via 610*b* may extend in a direction away from the first plate 612*a* and the second plate 612*b* towards the second leaky surface wave launcher 608*b* and the third via 610*c* and the fourth via 610*d* may extend in a direction away from the third plate 612*c* and the fourth plate 612*d* towards the first leaky surface wave launcher 608*a*.

The first dipole leaky surface wave launcher 608*a* and the second dipole leaky surface wave launcher 608*b* may operate the same as or similar to the dipole leaky surface wave launcher 508 of FIG. 5. The first dipole leaky surface wave launcher 608*a* may generate a first leaky wave that propagates at least a portion of the first package 602 and an environment proximate the first package 602. The first leaky wave may include the sideband signals. The second dipole leaky surface wave launcher 608*b* may generate a second leaky wave that propagates at least a portion of the second package 606 and an environment proximate the second package 606. The second leaky wave may include the sideband signals.

The first dipole leaky surface wave launcher 608*a* and the second dipole leaky surface wave launcher 608*b* may be physically positioned proximate each other to perform NFC coupling. The first dipole leaky surface wave launcher 608*a* may receive the second leaky wave. The second dipole leaky surface wave launcher 608*b* may receive the first leaky wave.

Figure 7:
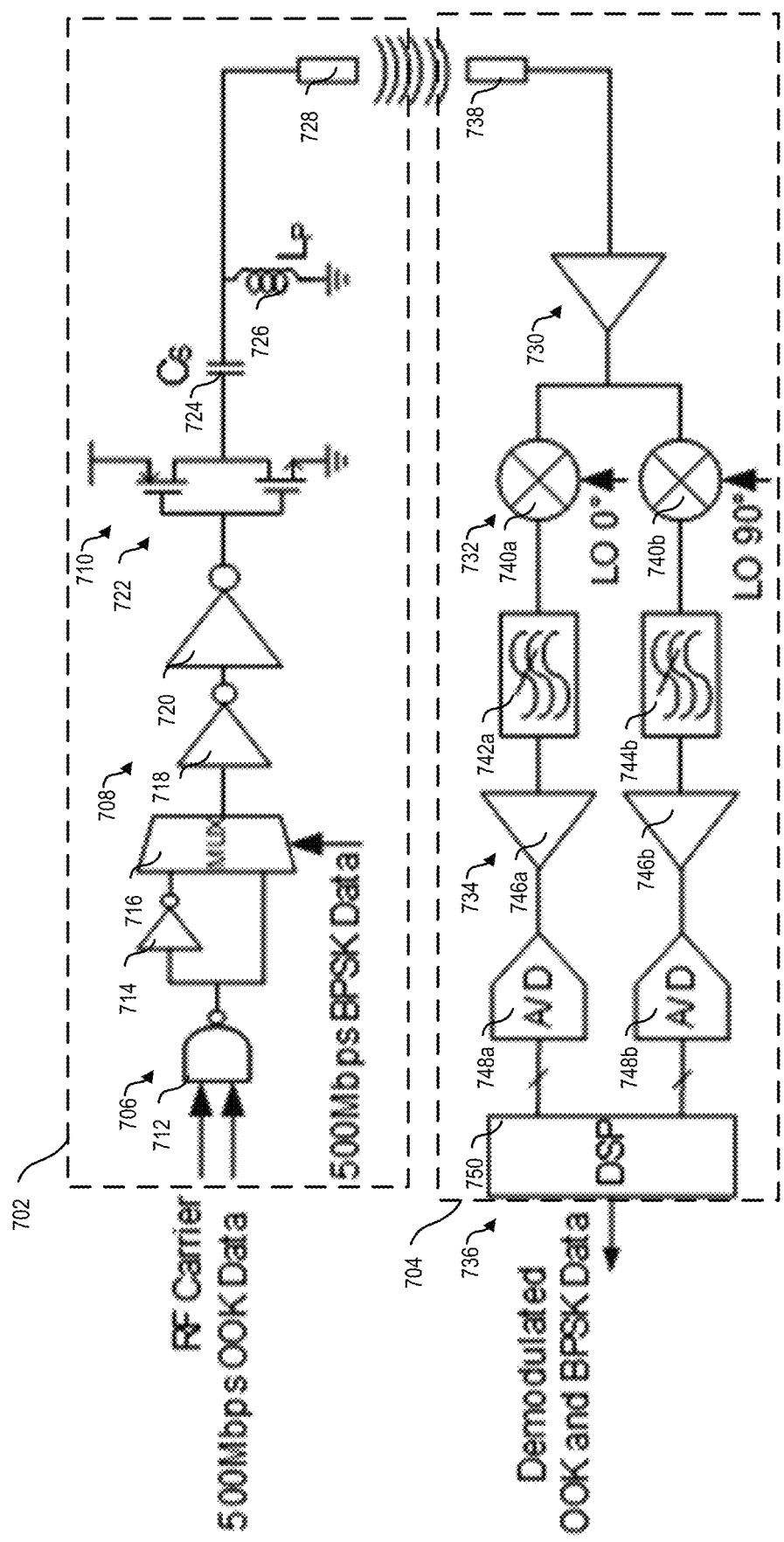
FIG. 7 illustrates an example transmit chain and an example receive chain that may be implemented in the environment of FIG. 1.

FIG. 7 illustrates an example transmit chain 702 and an example receive chain 704 that may be implemented in the environment 100 of FIG. 1, in accordance with at least one aspect described in the present disclosure.

The transmit chain 702 may include a modulator stage 706, a transmit amplifier stage 708, a matching network 710, and a transmit antenna element 728. The modulator stage 706 may include an and gate 712, an inverter 714, and a multiplexer 716. The transmit amplifier stage 708 may include a class-D power amplifier (PA) 718 and a buffer amplifier 720. The matching network 710 may include a transistor pair 722, a capacitive element 724, and an inductive element 726. In some aspects, the transmit antenna element 728 may correspond to at least one of the leaky surface wave launchers 208, 408*a*-*b*, and 508 of FIGS. 2, 4, and 5. In these and other aspects, a receive antenna element 738 may correspond to at least one of the leaky surface wave launchers 208, 408*a*-*b*, and 508 of FIGS. 2, 4, and 5.

An output of the and gate 712 may be electrically coupled to an input of the inverter 714 and a first input of the multiplexer 716. An output of the inverter 714 may be electrically coupled to a second input of the multiplexer 716. An output of the multiplexer 716 may be electrically coupled to an input of the class-D PA 718. An output of the class-D PA 718 may be electrically coupled to an input of the buffer amplifier 720. An output of the buffer amplifier 720 may be electrically coupled to gates of the transistor pair 722. The transistor pair 722 may be electrically coupled to an input voltage and a ground of the transmit chain 702. A first terminal of the capacitive element 724 may be electrically coupled to drains of the transistor pair 722. A second terminal of the capacitive element 724 may be electrically coupled to a first terminal of the inductive element 726 and the transmit antenna element 728. A second terminal of the inductive element 726 may be electrically coupled to the ground of the transmit chain.

The receive chain 704 may include the receive antenna element 738, a receive amplifier stage 730, a frequency converter 732, a filter stage 734, and a digital stage 736. The frequency converter 732 may include a first down converter 740a and a second down converter 740b. The filter stage 734 may include a first filter 742a, a second filter 742b, a first converter amplifier 746a, and a second converter amplifier 746b. The digital stage 736 may include a first analog to digital converter (ADC) 748a, a second ADC 748b, and a digital signal processor (DSP) 750.

The receive antenna element 738 may be wirelessly coupled to the transmit antenna element 728. The receive antenna element 738 may be electrically coupled to an input of the receive amplifier stage 730. An output of the receive amplifier stage 730 may be electrically coupled to an input of the first down converter 740a and an input of the second down converter 740b. An output of the first down converter 740a may be electrically coupled to an input of the first filter 742a. An output of the second down converter 740b may be electrically coupled to an input of the second filter 742b.

An output of the first filter 742a may be electrically coupled to an input of the first converter amplifier 746a. An output of the second filter 742b may be electrically coupled to an input of the second converter amplifier 746b. An output of the first converter amplifier 746a may be electrically coupled to an input of the first ADC 748a. An output of the second converter amplifier 746b may be electrically coupled to an input of the second ADC 748b. An output of the first ADC 748a may be electrically coupled to a first input of the DSP 750. An output of the second ADC 748b may be electrically coupled to a second input of the DSP 750.

The modulator stage 706 may generate a modulated signal. The modulator stage 706 may generate the modulated signal according to a first modulation scheme based on a carrier signal and a second modulation scheme. The carrier signal may include data. In addition, the carrier signal may be at a first frequency within a radio frequency (RF) domain. In some aspects, the modulator stage 706 may generate the modulated signal at the first frequency.

The and gate 712 may gate the carrier signal and a first signal to generate a gate signal. The and gate 712 may generate the gate signal according to the first modulation scheme. The inverter 714 may generate an inverted signal based on the gate signal. The multiplexer 716 may multiplex the gate signal and the inverted signal based on a second signal to generate the modulated signal. In some aspects, the multiplexer 716 may modulate the second signal according to a second modulation scheme. In these and other aspects, the second signal may include data. The multiplexer 716 may include the data of the carrier signal and the data of the second signal.

The transmit amplifier stage 708 may amplify an amplitude of the modulated signal to generate a transmit amplified signal. The transmit amplifier stage 708 may amplify the amplitude based on a gain setting of the transmit amplifier stage 708. The transmit amplifier stage 708 may generate the transmit amplified signal at the first frequency. In some aspects, the class-D PA 718 may amplify the amplitude of the modulation signal to generate an intermediate signal. The class-D PA 718 may amplify the amplitude based on a gain setting of the class-D PA 718.

The buffer amplifier 720 may amplify the amplitude the of the intermediate signal to generate the transmit amplified signal. The buffer amplifier 720 may amplify the amplitude based on a gain setting of the buffer amplifier 720. In some aspects, the gain setting of the transmit amplifier stage 708 may include the gain setting of the class-D PA 718 and the gain setting of the buffer amplifier 720.

The matching network 710 may generate a matched signal. The matching network 710 may generate the matched signal based on the transmit amplified signal. In some aspects, the matching network 710 may generate the matched signal to match an impedance of the circuit (e.g., the package transceiver 106 or the device transceiver 107) and the leaky surface wave launcher (e.g., the package antenna element 108 or the device antenna element 109). The matching network 710 may provide the matched signal to the transmit antenna element 728. In some aspects, at least a portion of the sideband signals may include the matched signal. In these and other aspects, the matching network 710 may generate the matched signal at the first frequency. The transmit antenna element 728 may wirelessly transmit the sideband signals including the matching signal at the first frequency.

The receive antenna element 7378 may wirelessly receive the sideband signals including the matched signal at the first frequency. The receive amplifier stage 730 may amplify the sideband signals to generate a receive amplified signal. In some aspects, the receive amplifier stage 730 may generate the receive amplified signal at the first frequency.

The frequency converter 732 may down convert a frequency of the receive amplified signal to generate a converted signal. The frequency converter 732 may generate the converted signal at a second frequency within a baseband domain. The first down converter 740a may down convert the frequency of the amplified signal according to a first phase configuration. The first down converter 740a may generate a first intermediate converted signal. The second down converter 740b may down convert the frequency of the amplified signal according to a second phase configuration. In some aspects, the second phase configuration may be out of phase with the first phase configuration. The second down converter 740b may generate a second intermediate converted signal. In some aspects, the converted signal may include the first intermediate converted signal and the second intermediate converted signal.

The filter stage 734 may generate a filtered signal based on the converted signal. The filter stage 734 may generate the filtered signal at the second frequency. The first filter 742a may generate a first intermediate filtered signal based on the first intermediate converted signal. The second filter 742b may generate a second intermediate filtered signal based on the second intermediate converted signal. The first converter amplifier 746a may amplify an amplitude of the first intermediate filtered signal to generate a first filtered signal. The first converter amplifier 746a may amplify the amplitude based on a gain setting of the first converter amplifier 746a. The second converter amplifier 746b may amplify an amplitude of the second intermediate filtered signal to generate a second filtered signal. The second converter amplifier 746b may amplify the amplitude based on a gain setting of the second converter amplifier 746b. In some aspects, the filtered signal may include the first filtered signal and the second filtered signal.

The digital stage 736 may generate a digital signal representative of the filtered signal. At least a portion of the sideband signals may include the digital signal. The digital stage 736 may generate the digital signal at the second frequency. The first ADC 748a may generate a first intermediate digital signal representative of at least a portion of the first filtered signal. The second ADC 748b may generate a second intermediate digital signal representative of at least a portion of the second filtered signal. The DSP 750 may generate the digital signal representative of the first intermediate digital signal and the second intermediate digital signal.

Figure 8:
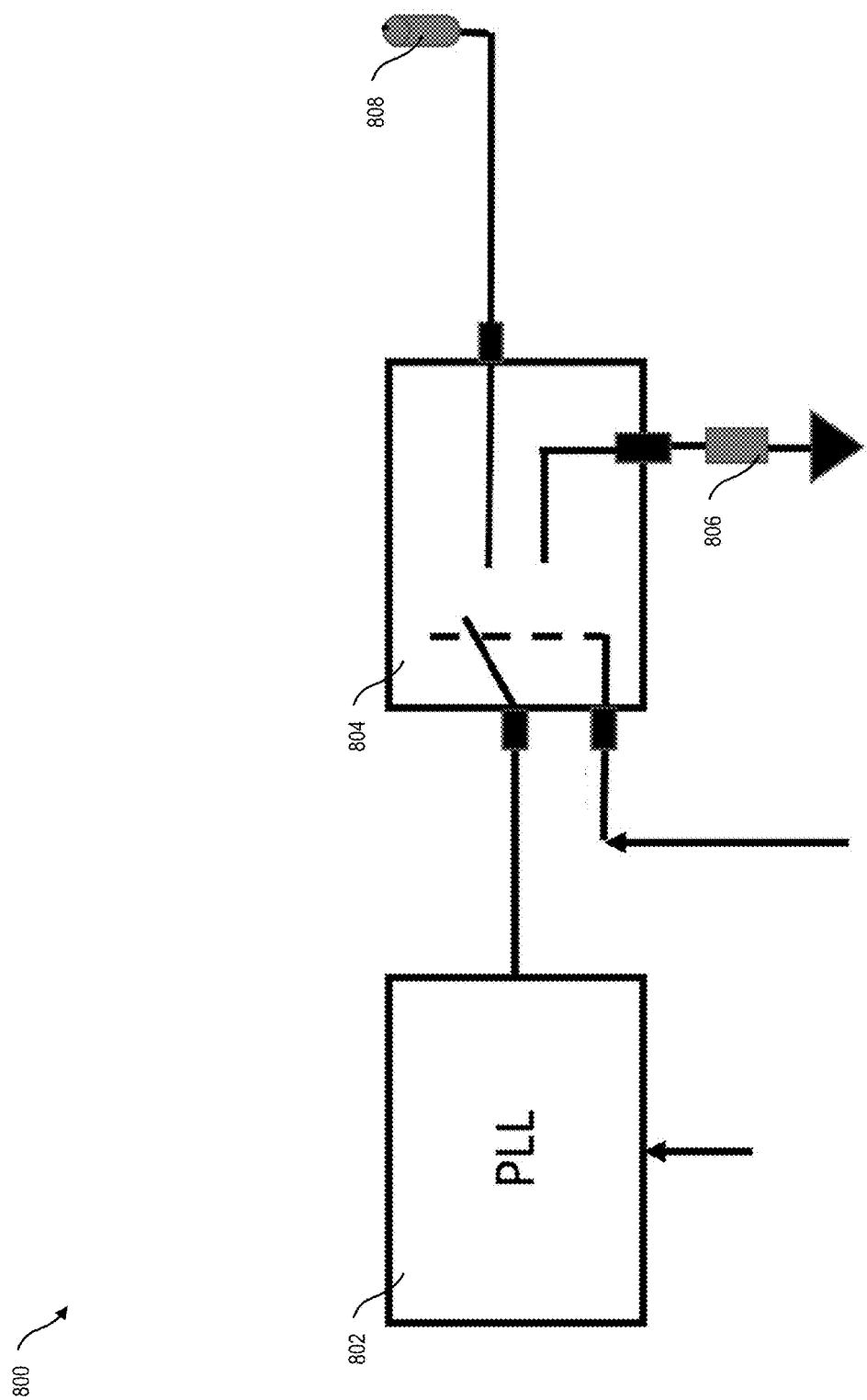
FIG. 8 illustrates an example transmitter that may be implemented in the environment of FIG. 1.

FIG. 8 illustrates an example transmitter 800 that may be implemented in the environment 100 of FIG. 1, in accordance with at least one aspect described in the present disclosure.

The transmitter 800 may include a phase lock loop (PLL) portion 802, a switch network 804, a resistive element 806, and a transmitter antenna element 808. In some aspects, the transmitter antenna element 808 may correspond to at least one of the leaky surface wave launchers 208, 408a-b, and 508 of FIGS. 2, 4, and 5. An output of the PLL portion 802 may be electrically coupled to a first input of the switch network 804. A first output of the switch network 804 may be electrically coupled to the transmitter antenna element 808. A second output of the switch network 804 may be electrically coupled to a first terminal of the resistive element 806. A second terminal of the resistive element 806 may be electrically coupled to a transmitter ground.

In some aspects, the transmitter 800 may include a PLL transmitter that generates a carrier signal at a resonant frequency of the transmitter antenna element 808. In these and other aspects, the sideband signals may include the carrier signal. The PLL portion 802 may receive an enable signal. In addition, the PLL portion 802 may generate the carrier signal based on the enable signal. The switch network 804 may receive a data signal via a second input. The switch network 804 may control when the carrier signal is provided to the first output (e.g., the transmitter antenna element 808) based on the data signal. The switch network may 804 control when the carrier signal is provided to the second output (e.g., the resistive element 806) based on the data signal.

Figure 9:
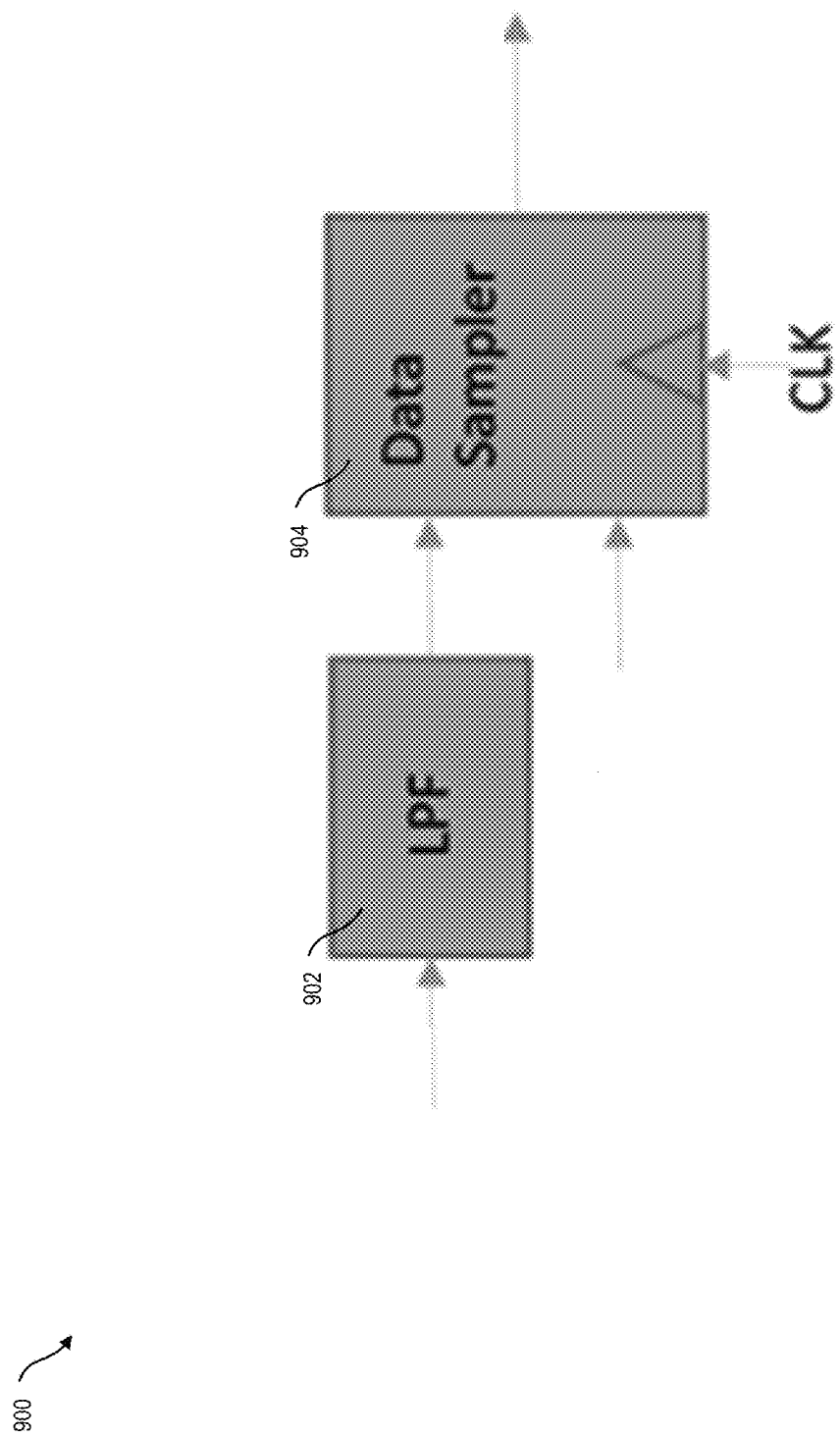
FIG. 9 illustrates an example receiver that may be implemented in the environment of FIG. 1.

FIG. 9 illustrates an example receiver 900 that may be implemented in the environment 100 of FIG. 1, in accordance with at least one aspect described in the present disclosure.

The receiver 900 may include a low pass filter 902 and a data sample 904. An input of the low pass filter 902 may be electrically coupled to a leaky surface wave launcher (not illustrated) (e.g., the leaky surface wave launchers 208, 408a-b, and 508 of FIGS. 2, 4, and 5). An output of the low pass filter 902 may be electrically coupled to a first input of the data sampler 904. An output of the data sampler 904 may be electrically coupled the chip (not illustrated).

The low pass filter 902 may receive the sideband signals from the leaky surface wave launcher. The low pass filter 902 may prevent a portion of the sideband signals from propagating to generate a receive filtered signal. The data sampler 904 may receive the receive filtered signal. The data sampler 904 may receive a control signal via a second input and a clock signal via a third input. The data sampler 904 may recover data from the receive filtered signal to generate a recovered signal. The data sampler 904 may generate the recovered signal based on the control signal and the clock signal.

Figure 10:
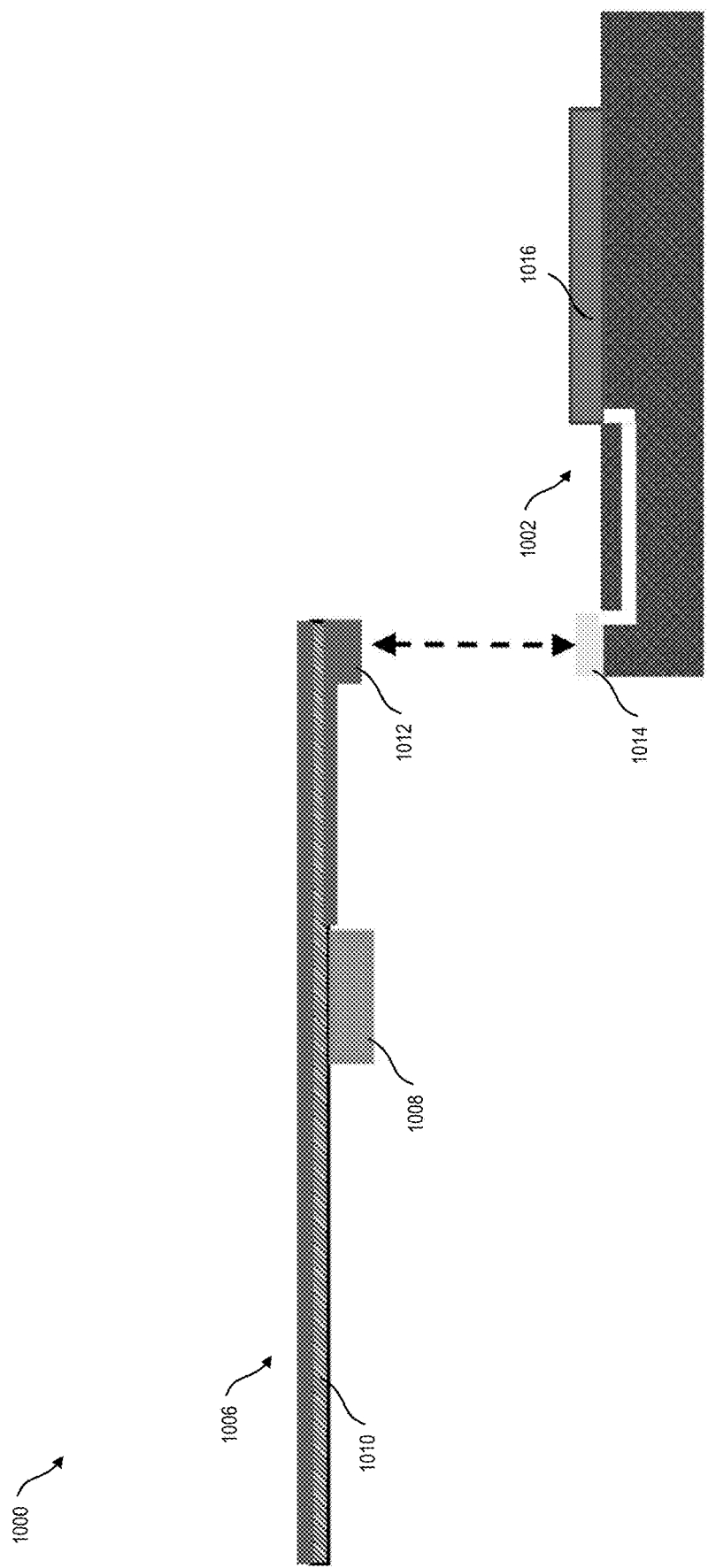
FIG. 10 illustrates an example environment to perform verification testing using near field communication (NFC) coupling.

FIG. 10 illustrates an example environment 1000 to perform verification testing using NFC coupling, in accordance with at least one aspect described in the present disclosure. The environment 1000 may include a probe 1006 and a package 1002. The probe 1006 may include a flex cable 1010, a probe transceiver 1008, and a probe pad 1012. The package 1002 may include a package pad 1014 and a circuit under test 1016. The probe pad 1012 may include a leaky surface wave launcher (not illustrated). The leaky surface wave launcher of the probe pad 1012 may correspond to at least one of the leaky surface wave launchers 208, 408a-b, and 508 of FIGS. 2, 4, and 5. For example, the leaky surface wave launcher of the probe pad 1012 may include a monopole leaky surface wave launcher or a dipole leaky surface wave launcher. The probe transceiver 1008 may correspond to the device transceiver 107 of FIG. 1.

The package pad 1014 may include a leaky surface wave launcher (not illustrated) and a transceiver (not illustrated). The leaky surface wave launcher of the package pad 1014 may correspond to at least one of the leaky surface wave launchers 208, 408a-b, and 508 of FIGS. 2, 4, and 5. For example, the leaky surface wave launcher of the package pad 1014 may include a monopole leaky surface wave launcher or a dipole leaky surface wave launcher. The transceiver of the package pad 1014 may correspond to the package transceiver 106 of FIG. 1.

The flex cable 1010 may electrically couple the probe transceiver 1008 to the probe pad 1012. In addition, the flex cable 1010 may electrically couple the probe transceiver 1008 to an external device (not illustrated). The package pad 1014 may be electrically coupled to the circuit under test 1016.

The probe 1006 (e.g., the probe pad 1012) may be configured to be placed physically proximate the package pad 1014 (e.g., the circuit under test). The probe 1006 may perform test operations of the circuit under test using the sideband signals transmitted and received wirelessly.

The leaky surface wave launcher of the probe pad 1012 may wirelessly provide sideband signals to and wirelessly receive the sideband signals from the leaky surface wave launcher of the package pad 1014. The probe transceiver 1008 may process the sideband signals received by the leaky surface wave launcher of the probe pad 1012. The probe transceiver 1008 may also generate the sideband signals for wireless transmission by the leaky surface wave launcher of the probe pad 1012.

The leaky surface wave launcher of the probe pad 1012 may generate a first leaky wave that propagates at least a portion of the probe pad 1012 and an environment proximate the probe pad 1012. The first leaky wave may include the sideband signals. The leaky surface wave launcher of the package pad 1014 may generate a second leaky wave that propagates at least a portion of the package pad 1014 and an environment proximate the package pad 1014. The second leaky wave may include the sideband signals.

Figure 11:
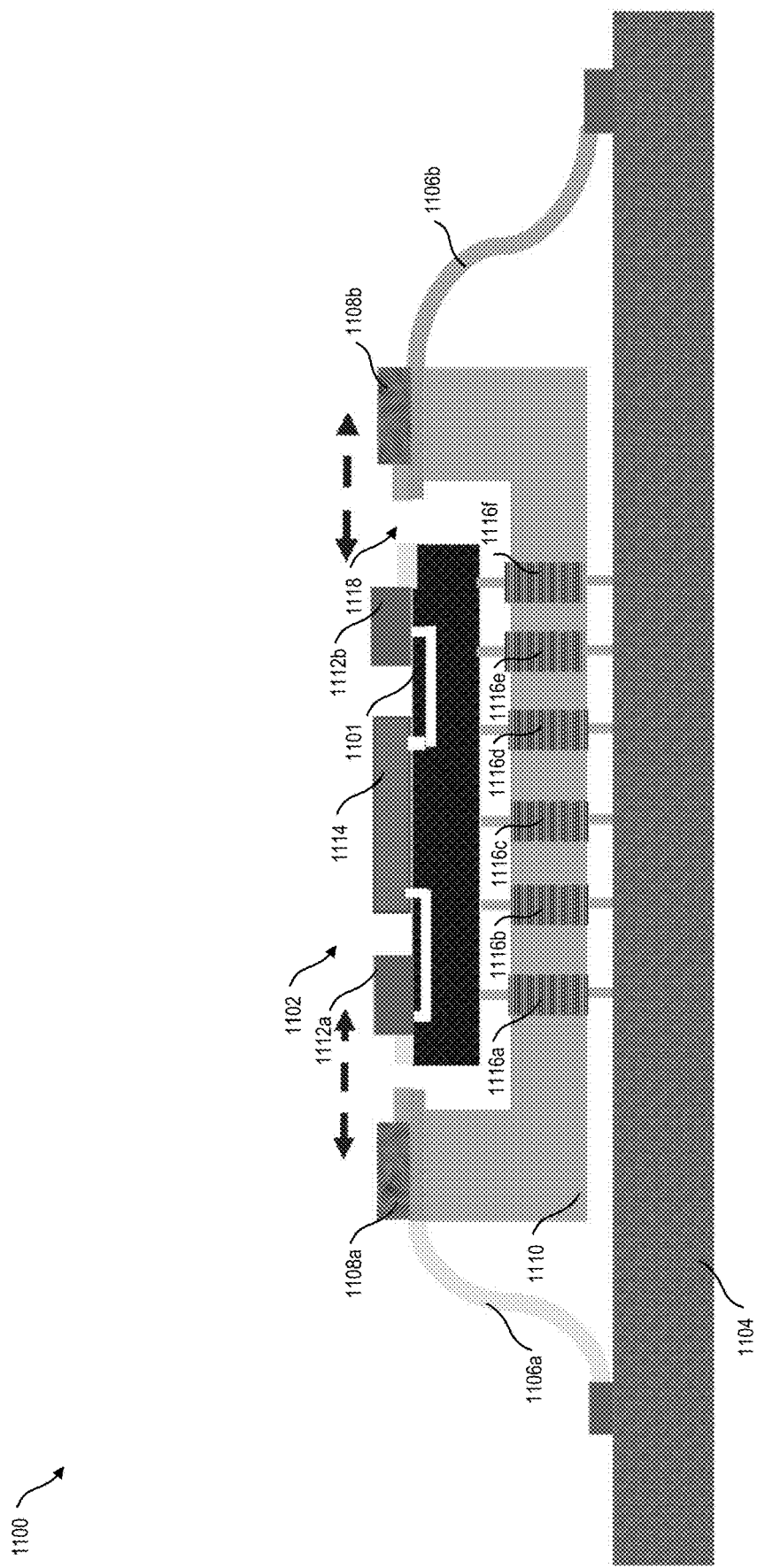
FIG. 11 illustrates another example environment to perform verification testing using NFC coupling.

FIG. 11 illustrates another example environment 1100 to perform verification testing using NFC coupling, in accordance with at least one aspect described in the present disclosure. The environment 1100 may include a package 1102 (e.g., a package under test), a test socket 1110, EAAs 1108a-b, a mother board 1104, and cables 1106a-b. The package 1102 may include a package substrate 1101, SPAs 1112a-b, and a die 1114 (e.g., a circuit under test). The test socket 1110 may define an opening 1118. The opening 1118 may be defined to receive the package 1102. In addition, the test socket may include vias 1116*a-f*.

The EAAs 1108*a-b* and the SPAs 1112*a-b* may include leaky surface wave launchers (not illustrated). The leaky surface wave launchers of the EAAs 1108*a-b* and the SPAs 1112*a-b* may correspond to at least one of the leaky surface wave launchers 208, 408*a-b*, and 508 of FIGS. 2, 4, and 5. For example, the leaky surface wave launcher of the EAAs 1108*a-b* and the SPAs 1112*a-b* may include a monopole leaky surface wave launcher or a dipole leaky surface wave launcher. The EAAs 1108*a-b* and the SPAs 1112*a-b* may also include transceivers (not illustrated) that are electrically coupled to the corresponding leaky surface wave launchers. The transceivers of the EAAs 1108*a-b* and the SPAs 1112*a-b* may correspond to the device transceiver 107 of FIG. 1.

The vias 116*a-f* may electrically couple the package 1102 to the mother board 1104 when the package 1102 is placed in the opening 1118. The EEAs 1108*a-b* may be physically positioned on a surface of the test socket 1110. The mother board 1104 may be electrically coupled to the EAAs 1108*a-b* via the cables 1106*a-b*.

The opening 1118 may be defined such that the SPAs 1112*a-b* are physically positioned proximate the EAAs 1108*a-b* when the package 1102 is within the opening 1118. The mother board 1104 may perform test operations of the package 1102 (e.g., the die 1114) using the sideband signals.

In some aspects, the leaky surface wave launchers of the EAAs 1108*a-b* may perform NFC coupling with the corresponding leaky surface wave launchers of the SPAs 1112*a-b*. In some aspects, the leaky surface wave launchers of the EAAs 1108*a-b* and the SPAs 1112*a-b* may be configured as edge couplers to perform the NFC coupling via an edge of the EAAs 1108*a-b* and the SPAs 1112*a-b*.

The leaky surface wave launchers of the EAAs 1108*a-b* and the SPAs 1112*a-b* may wirelessly transmit and wirelessly receive at least a portion of the sideband signals. The EAAs 1108*a-b* may receive from and provide to the mother board 1104 the at least the portion of the sideband signals via the cables 1106*a-b*.

The leaky surface wave launchers of the EAAs 1108*a-b* may generate a first leaky wave that propagates at least a portion of the corresponding EAAs 1108*a-b* and an environment proximate the corresponding EAAs 1108*a-b*. The first leaky wave may include the at least the portion of the sideband signals. The leaky surface wave launchers of the SPAs 1112*a-b* may generate a second leaky wave that propagates at least a portion of the SPAs 1112*a-b* and an environment proximate the SPAs 1112*a-b*. The second leaky wave may include the at least the portion of the sideband signals.

The transceivers of the EAAs 1108*a-b* and the SPAs 1112*a-b* may process the at least the portion of the sideband signals. In addition, the transceivers of the EAAs 1108*a-b* and the SPAs 1112*a-b* may generate the sideband signals to be wirelessly transmitted by the leaky surface wave launchers of the EAAs 1108*a-b* and the SPAs 1112*a-b*. The mother board 1104 may provide at least a portion of the sideband signals to the package 1102 through the vias 1116*a-f*.

Figure 12:
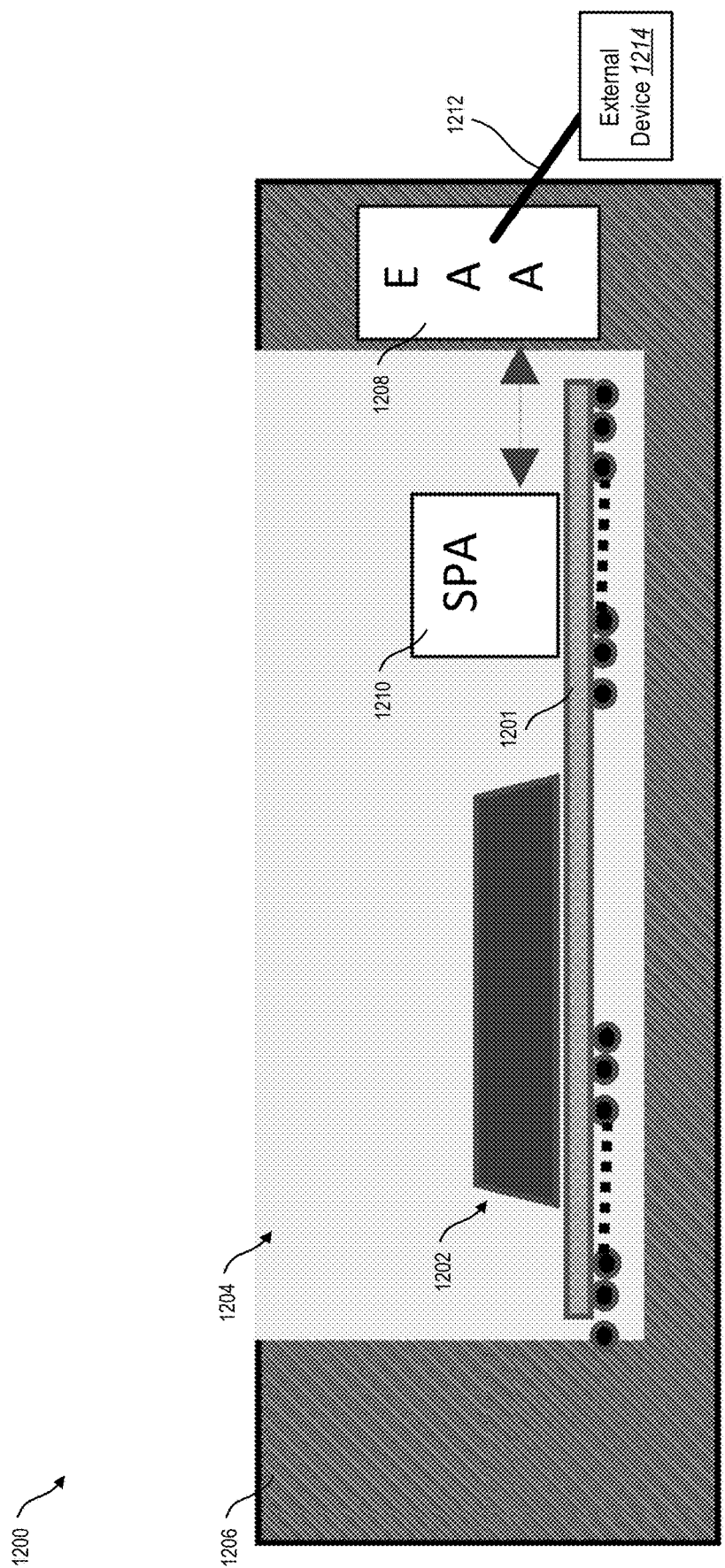
FIG. 12 illustrates an example HVM test system to perform verification testing using NFC coupling.

FIG. 12 illustrates an example HVM test system 1200 to perform verification testing using NFC coupling, in accordance with at least one aspect described in the present disclosure. The HVM test system 1200 may include a test socket 1206, a package 1202 (e.g., a package under test), a SPA 1210, a cable 1212, and an external device 1214. The test socket 1206 may include an EAA 1208. The test socket 1206 may define an opening 1204. The opening 1204 may be defined to receive the package 1202, the SPA 1210, or some combination thereof. The SPA 1210 may be electrically coupled to the package 1202 via a package substrate 1201 or similar component. The external device 1214 may correspond to the test device 113 of FIG. 1. The package 1202 and the SPA 1210 may correspond to the package 102 of FIG. 1.

The EAA 1208 and the SPA 1210 may include leaky surface wave launchers (not illustrated). The leaky surface wave launchers of the EAA 1208 and the SPA 1210 may correspond to at least one of the leaky surface wave launchers 208, 408*a-b*, and 508 of FIGS. 2, 4, and 5. For example, the leaky surface wave launcher of the EAA 1208 and the SPA 1210 may include a monopole leaky surface wave launcher or a dipole leaky surface wave launcher. The EAA 1208 and the SPA 1210 may also include transceivers (not illustrated) that are electrically coupled to the corresponding leaky surface wave launchers. The transceivers of the EAA 1208 and the SPA 1210 may correspond to the device transceiver 107 of FIG. 1.

The opening 1204 may be defined such that the SPA 1210 is physically positioned proximate the EAA 1208 when the package 1202 is within the opening 1204. The EAA 1208 may be electrically coupled to the external device 1214 via the cable 1212. The external device 1214 may perform test operations of the package 1202 using the sideband signals. The cable 1212 may include a flex cable.

In some aspects, the leaky surface wave launcher of the EAA 1208 may perform NFC coupling with the leaky surface wave launcher of the SPA 1210. In some aspects, the leaky surface wave launchers of the EAA 1208 and the SPA 1210 may be configured as edge couplers to perform the NFC coupling via an edge of the EAA 1208 and the SPA 1210. The leaky surface wave launchers of the EAA 1208 and the SPA 1210 may wirelessly transmit and wirelessly receive the sideband signals. The EAA 1208 may receive from and provide to the external device 1214 the sideband signals via the cable 1212.

The leaky surface wave launcher of the EAA 1208 may generate a first leaky wave that propagates at least a portion of the EAA 1208 and an environment proximate the EAA 1208. The first leaky wave may include the sideband signals. The leaky surface wave launcher of the SPA 1210 may generate a second leaky wave that propagates at least a portion of the SPA 1210 and an environment proximate the SPA 1210. The second leaky wave may include the sideband signals.

The transceivers of the EAA 1208 and the SPA 1210 may process the sideband signals. In addition, the transceivers of the EAA 1208 and the SPA 1210 may generate the sideband signals to be wirelessly transmitted by the leaky surface wave launchers of the EAA 1208 and the SPA 1210.

Figure 13:
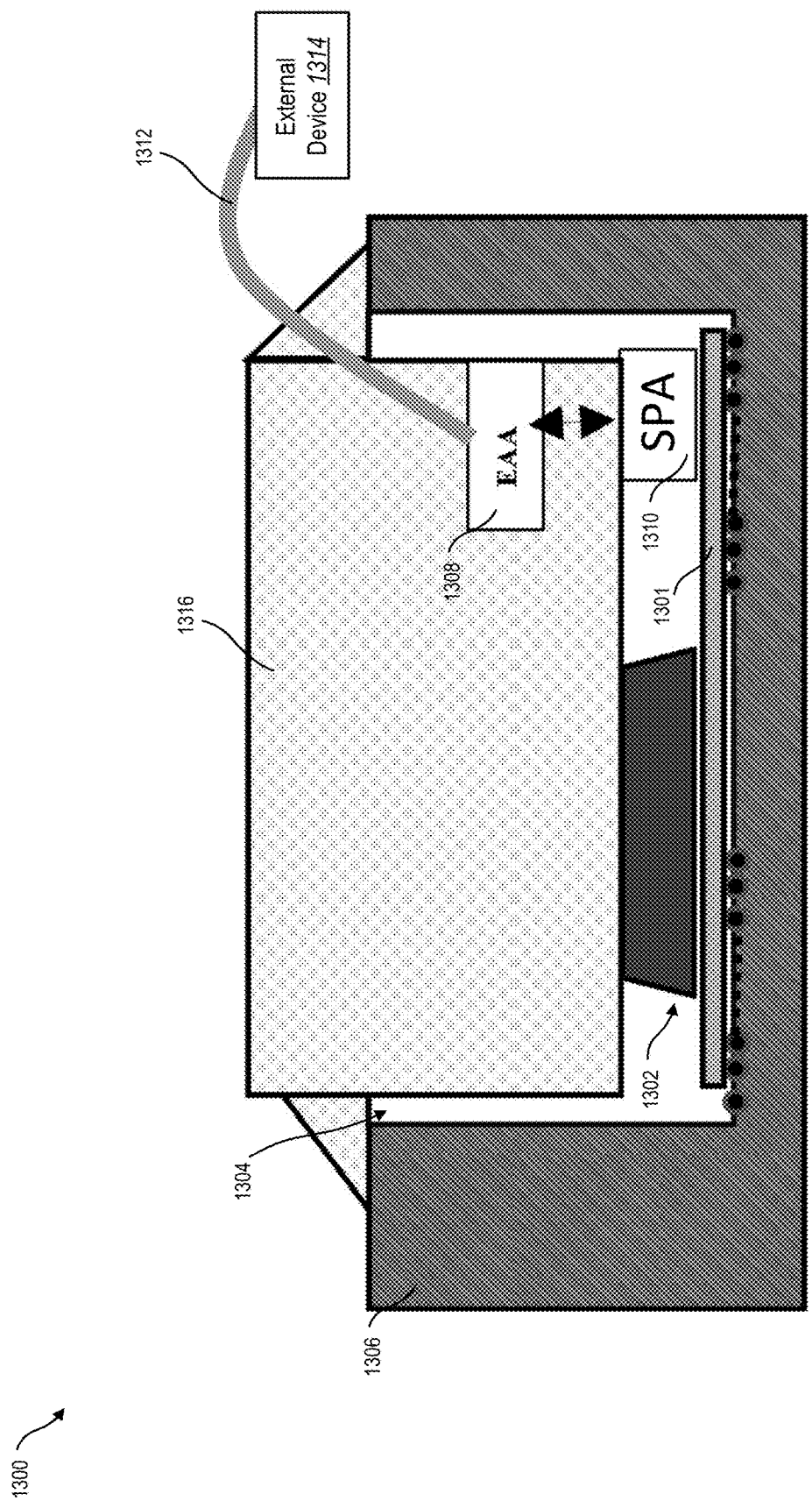
FIG. 13 illustrates another example HVM test system to perform verification testing using NFC coupling.

FIG. 13 illustrates another example HVM test system 1300 to perform verification testing using NFC coupling, in accordance with at least one aspect described in the present disclosure. The HVM test system 1300 may include a test socket 1306, a package 1302 (e.g., a package under test), a SPA 1310, a cable 1312, a test socket lid 1316, and an external device 1314. The test socket 1306 may include an EAA 1308. The test socket 1306 may define an opening 1304. The opening 1304 may be defined to receive the package 1302, the SPA 1310, or some combination thereof. The SPA 1310 may be electrically coupled to the package 1302 via a package substrate 1301 or similar component. The external device 1314 may correspond to the test device 113 of FIG. 1.

The EAA 1308 and the SPA 1310 may include leaky surface wave launchers (not illustrated). The leaky surface wave launchers of the EAA 1308 and the SPA 1310 may correspond to at least one of the leaky surface wave launchers 208, 408*a-b*, and 508 of FIGS. 2, 4, and 5. For example, the leaky surface wave launcher of the EAA 1308 and the SPA 1310 may include a monopole leaky surface wave launcher or a dipole leaky surface wave launcher. The EAA 1308 and the SPA 1310 may also include transceivers (not illustrated) that are electrically coupled to the corresponding leaky surface wave launchers. The transceivers of the EAA 1308 and the SPA 1310 may correspond to the device transceiver 107 of FIG. 1. The package 1302 and the SPA 1310 may correspond to the package 102 of FIG. 1.

The opening 1304 may be defined such that at least a portion of the socket lid 1316 may be placed in at least a portion of the opening 1304. The socket lid 1316 may be placed in the at least a portion of the opening such that the SPA 1310 is physically positioned proximate the EAA 1308 when the package 1302 and the socket lid 1316 are within the opening 1204. The EAA 1308 may be electrically coupled to the external device 1314 via the cable 1312. The external device 1314 may perform test operations of the package 1302 using the sideband signals. The cable 1312 may include a flex cable.

In some aspects, the leaky surface wave launcher of the EAA 1308 may perform NFC coupling with the leaky surface wave launcher of the SPA 1310. In some aspects, the leaky surface wave launchers of the EAA 1308 and the SPA 1310 may be configured as edge couplers to perform the NFC coupling via an edge of the EAA 1308 and the SPA 1310. The leaky surface wave launchers of the EAA 1308 and the SPA 1310 may wirelessly transmit and wirelessly receive the sideband signals. The EAA 1308 may receive from and provide to the external device 1314 the sideband signals via the cable 1312.

The leaky surface wave launcher of the EAA 1308 may generate a first leaky wave that propagates at least a portion of the EAA 1308 and an environment proximate the EAA 1308. The first leaky wave may include the sideband signals. The leaky surface wave launcher of the SPA 1310 may generate a second leaky wave that propagates at least a portion of the SPA 1310 and an environment proximate the SPA 1310. The second leaky wave may include the sideband signals.

The transceivers of the EAA 1308 and the SPA 1310 may process the sideband signals. In addition, the transceivers of the EAA 1308 and the SPA 1310 may generate the sideband signals to be wirelessly transmitted by the leaky surface wave launchers of the EAA 1308 and the SPA 1310. In some aspects, the socket lid 1316 may be configured to be placed in the at least a portion of the opening 1304 by hand.

Figure 14:
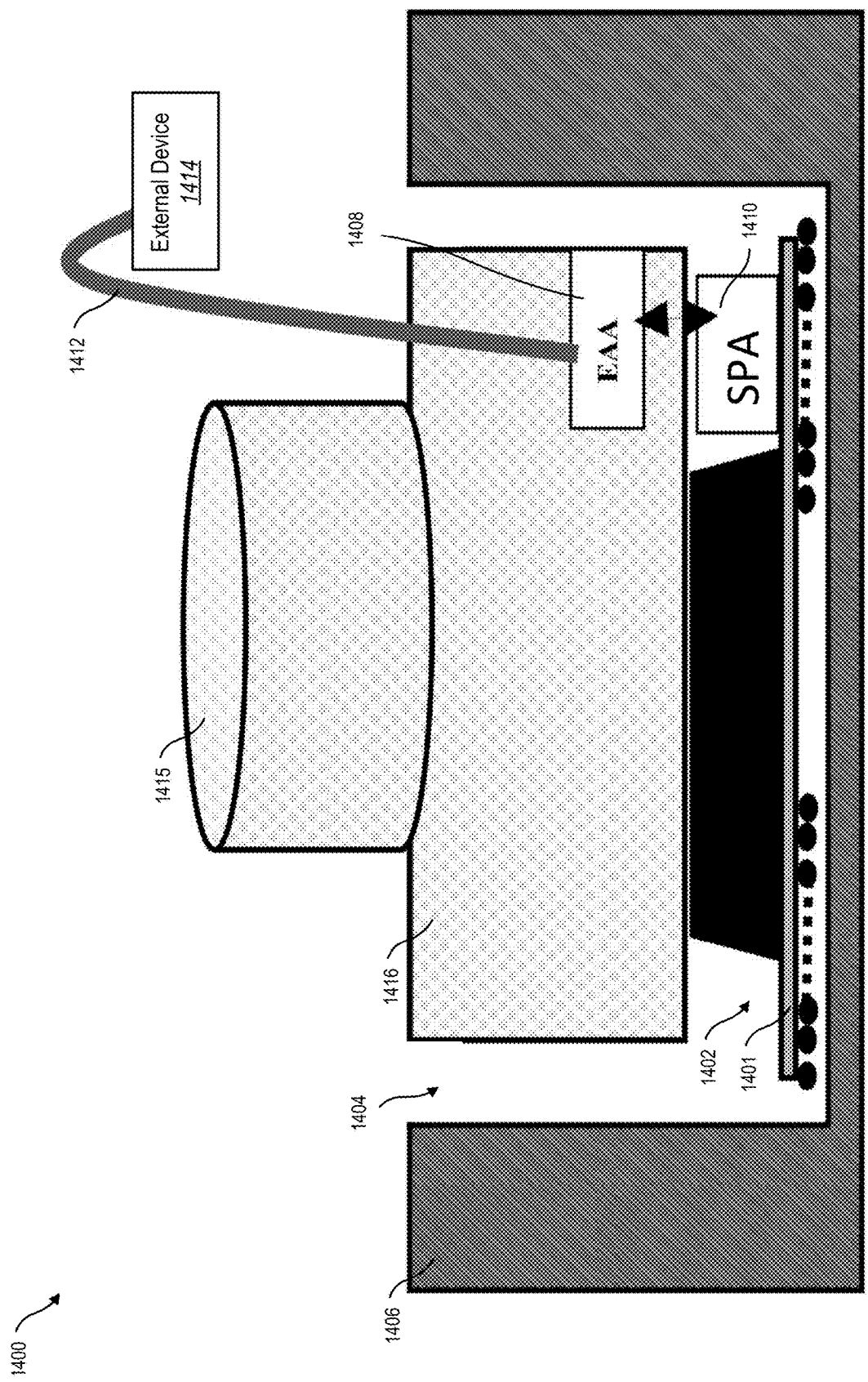
FIG. 14 illustrates yet another example HVM test system to perform verification tests using NFC coupling, all according to at least one aspect described in the present disclosure.

FIG. 14 illustrates yet another example HVM test system 1400 to perform verification tests using NFC coupling, in accordance with at least one aspect described in the present disclosure. The HVM test system 1400 may include a test socket 1406, a package 1402 (e.g., a package under test), a SPA 1410, a cable 1412, a test socket lid 1416, a pedestal 1415, and an external device 1414. The test socket 1406 may include an EAA 1408. The test socket 1406 may define an opening 1404. The opening 1404 may be defined to receive the package 1402, the SPA 1410, or some combination thereof. The SPA 1410 may be electrically coupled to the package 1402 via a package substrate 1401 or similar component. The external device 1414 may correspond to the test device 113 of FIG. 1. The pedestal 1415 may be mechanically coupled to the socket lid 1416.

The EAA 1408 and the SPA 1410 may include leaky surface wave launchers (not illustrated). The leaky surface wave launchers of the EAA 1408 and the SPA 1410 may correspond to at least one of the leaky surface wave launchers 208, 408*a-b*, and 508 of FIGS. 2, 4, and 5. For example, the leaky surface wave launcher of the EAA 1408 and the SPA 1410 may include a monopole leaky surface wave launcher or a dipole leaky surface wave launcher. The EAA 1408 and the SPA 1410 may also include transceivers (not illustrated) that are electrically coupled to the corresponding leaky surface wave launchers. The transceivers of the EAA 1408 and the SPA 1410 may correspond to the device transceiver 107 of FIG. 1.

The opening 1404 may be defined such that at least a portion of the socket lid 1416 may be placed in at least a portion of the opening 1404. The socket lid 1416 may be placed in the at least a portion of the opening such that the SPA 1410 is physically positioned proximate the EAA 1408 when the package 1402 and the socket lid 1416 are within the opening 1404. The EAA 1408 may be electrically coupled to the external device 1414 via the cable 1412. The external device 1414 may perform test operations of the package 1402 using the sideband signals. The cable 1412 may include a flex cable.

In some aspects, the leaky surface wave launcher of the EAA 1408 may perform NFC coupling with the corresponding leaky surface wave launcher of the SPA 1410. In some aspects, the leaky surface wave launchers of the EAA 1408 and the SPA 1410 may be configured as edge couplers to perform the NFC coupling via an edge of the EAA 1408 and the SPA 1410. The leaky surface wave launchers of the EAA 1408 and the SPA 1410 may wirelessly transmit and wirelessly receive the sideband signals. The EAA 1408 may receive from and provide to the external device 1414 the sideband signals via the cable 1412.

The leaky surface wave launcher of the EAA 1408 may generate a first leaky wave that propagates at least a portion of the EAA 1408 and an environment proximate the EAA 1408. The first leaky wave may include the sideband signals. The leaky surface wave launcher of the SPA 1410 may generate a second leaky wave that propagates at least a portion of the SPA 1410 and an environment proximate the SPA 1410. The second leaky wave may include the sideband signals.

The transceivers of the EAA 1408 and the SPA 1410 may process the sideband signals. In addition, the transceivers of the EAA 1408 and the SPA 1410 may generate the sideband signals to be wirelessly transmitted by the leaky surface wave launchers of the EAA 1408 and the SPA 1410. In some aspects, the socket lid 1416 may be configured to be placed in the at least a portion of the opening 1404 by a machine that controls the pedestal 1415.

A package substrate may include a circuit and a leaky surface wave launcher. The circuit may perform engineering tests and end-user operations using sideband signals. The leaky surface wave launcher may perform NFC wireless communication (e.g., NFC coupling). The leaky surface wave launcher may include a via and a strip line. The via may be electrically coupled to the circuit. The strip line may be electrically coupled to the via. The via may provide the sideband signals to and receive the sideband signals from the circuit. The strip line may be excited by the sideband signals to wirelessly couple the leaky surface wave launcher with an external device. The strip line and the via may be unbalanced such that the strip line generates a leaky wave that propagates at least a portion of the package substrate and an environment proximate the package substrate.

In some aspects, the leaky surface wave launcher may be configured to radiate the leaky wave in a Z direction relative to edges of the package substrate. The strip line may generate the leaky wave in the environment proximate the package substrate in a direction normal a surface of the package substrate. In some aspects, the leaky surface wave launcher may include an edge coupler to perform the NFC coupling through an edge of the package substrate. In these and other aspects, the leaky surface wave launcher may include a coupling efficiency sufficient to permit a distance up to ten mm.

In some aspects, the leaky wave may decay within the environment proximate the package substrate based on an attenuation coefficient. In these and other aspects, the attenuation coefficient may be determined according to:

$$\alpha \approx 2\pi k \left( \frac{\mu_d}{\mu_0} - \frac{\varepsilon_d}{\varepsilon_0} \right) \frac{t}{\lambda}$$

In which, k represents a Rician factor, $\mu_d$ represents a permeability of the package substrate, $\mu_0$ represents a permeability of a vacuum, $\varepsilon_d$ represents a permittivity of the package substrate, $\varepsilon_0$ represents a permittivity of a vacuum, t represents a thickness of the package substrate, and $\lambda$ represents a wavelength of the sideband signals in a vacuum. The attenuation coefficient may be dependent on the substrate thickness when the substrate is smaller than the wavelength of the sideband signals. In some aspects, the leaky wave may decay exponentially when propagating the environment proximate the package substrate.

The package substrate may include a ground layer. The ground layer may electrically ground the leaky surface wave launcher. In some aspects, the leaky wave may propagate the portion of the package substrate that is proximate at least a portion of the ground layer. In some aspects, the leaky surface wave may propagate a dielectric layer that is physically positioned adjacent the ground layer.

In some aspects, the external device may include a probe. The probe may include a second leaky surface wave launcher. The second leaky surface wave launcher may include a probe transceiver, a probe via, and a probe strip line. The second leaky surface wave launcher may perform NFC coupling. The probe transceiver may be electrically coupled to the second leaky surface wave launcher. The probe via may be electrically coupled between the probe transceiver and the probe strip line. The probe transceiver may generate and receive the sideband signals. The probe via may provide the sideband signals to and receive the sideband signals from the probe transceiver. The probe strip line may be excited by the sideband signals to wirelessly couple the leaky surface wave launcher of the package substrate (e.g., a first leaky surface wave launcher) with the second leaky surface wave launcher. The probe via and the probe strip line may be unbalanced such that the probe strip line generates a second leaky wave that propagates an environment proximate the probe.

In some aspects, the first leaky surface wave launcher and the second leaky surface wave launcher may include monopole antenna elements. In other aspects, the first leaky surface wave launcher and the second leaky surface wave launcher may include dipole antenna elements. In some aspects, the monopole antenna elements may support data rates of five hundred megabits per second at a distance of five mm.

In some aspects, the first leaky surface may include the diploe antenna element. The dipole antenna element may include the via (e.g., a first via) and the strip line (e.g., a second strip line), a second via, and a second strip line. The first via may provide a negative portion of the sideband signals. The first strip line may be excited by the negative portion of the sideband signals. The second via may be electrically coupled to the circuit and the second strip line.

The second via may provide a positive portion of the sideband signals to and receive the positive portion of the sideband signals from the circuit. The second strip line may be excited by the positive portion of the sideband signals. The first strip line may be excited by the negative portion and the second strip line may be excited by the positive portion to wirelessly couple the leaky surface wave launcher with the external device. In some aspects, the first strip line and the second strip line may generate the leaky wave. In some aspects, the dipole antenna element may permit greater transmission distances than a monopole antenna element.

In some aspects, the external device may include a probe. The probe may include a second leaky surface wave launcher. The second leaky surface wave launcher may include a probe transceiver, a third via, a third strip line, a fourth via, and a fourth strip line. The second leaky surface wave launcher may perform NFC coupling. The probe transceiver may be electrically coupled to the second leaky surface wave launcher. The third via may be electrically coupled between the probe transceiver and the third strip line. The fourth via may be electrically coupled between the probe transceiver and the fourth strip line. The probe transceiver may generate and receive the sideband signals.

The third via may provide the negative portion of the sideband signals to and receive the negative portion of the sideband signals from the probe transceiver. The third strip line may be excited by the negative portion of the sideband signals. The fourth via may provide the positive portion of the sideband signals to and receive the positive portion of the sideband signals from the probe transceiver. The fourth strip line may be excited by the positive portion of the sideband signals. The third strip line may be excited by the negative portion and the fourth strip line may be excited by the positive portion to wirelessly couple the second leaky surface wave launcher with the first leaky surface wave launcher. The third strip line and the fourth strip line may generate a second leaky wave that propagates at least a portion of the package substrate and an environment proximate the probe.

In some aspects, the leaky wave may include a substantially spherical mode. In addition, the leaky wave may include at least one of a TE mode and a TM mode.

In some aspects, the first leaky surface wave launcher and the second leaky surface wave launcher may be physically positioned so as to mirror each other. In these and other aspects, the strip line may include an open stub electrically coupled to the via. In addition, physical dimensions of the strip line may be based on a wavelength of the sideband signals.

In some aspects, wherein the circuit may include a transceiver electrically coupled between a portion of the circuit and the leaky surface wave launcher. The transceiver may process the sideband signals for use by the portion of the circuit and wireless transmission by the leaky surface wave launcher.

In some aspects, the transceiver may include a transmitter. The transmitter may include an all-digital RF modulation scheme. The all-digital scheme may up convert five hundred megabits per second of OOK data and five hundred megabits pers second BPSK data to RF. In these and other aspects, the transmitter may generate the sideband signals at al 0.5 bit per symbol modulate scheme at five hundred MHz.

The transceiver may perform switching operations using a digital signal to module a carrier signal. The transceiver may directly down convert the sideband signals received from the via.

In some aspects, the transceiver may include a transmitter chain. The transmitter chain may include a modulator stage, a transmit amplifier stage, and a matching network. The modulator stage may generate a modulated signal. The modulator stage may generate the modulated signals according to a first modulation scheme based on a carrier signal and a second modulation scheme. The transmit amplifier stage may amplify an amplitude of the modulated signal to generate a transmit amplified signal. The transmit amplifier stage may amplify the amplitude based on a gain setting of the transmit amplifier stage.

The matching network may generate a matched signal based on the transmit amplified signal. The matching network may generate the matched signal to match an impedance of the circuit and the leaky surface wave launcher. The matching network may provide the matched signal to the strip line. At least a portion of the sideband signals may include the matched signal. In some aspects, the strip line may generate the leaky wave based on the matched signal.

In some aspects, the carrier signal may include a first frequency within the RF domain. The modulator stage may generate the modulated signal at the first frequency. The transmit amplifier may generate the transmit amplified signal at the first frequency. The matching network may generate the matched signal at the first frequency. The leaky surface wave launcher may wirelessly transmit the sideband signals that include the matching signal at the first frequency.

In some aspects, the carrier signal may include data. The modulator stage may include an and gate, an inverter, and a multiplexer. The and gate may gate the carrier signal and the first signal to generate a gate signal according to the first modulation scheme. The inverter may generate an inverted signal based on the gate signal. The multiplexer may multiplex the gate signal and the inverted signal to generate the modulated signal. The multiplexer may gate the signals based on a second signal modulated according to the second modulation scheme. The second signal may include data. The modulated signal may include the data of the carrier signal and the data of the second signal.

The transmit amplifier stage may include a class-D PA and a buffer amplifier. The class-D PA may amplify the amplitude of the modulation signal to generate an intermediate signal. The class-D PA may amplify the amplitude based on a gain setting of the class-D PA. The buffer amplifier may amplify the amplitude of the intermediate signal to generate the transmit amplified signal. The buffer amplifier may amplify the amplitude based on a gain setting of the buffer amplifier. The gain setting of the transmit amplifier stage may include the gain setting of the class-D PA and the gain setting of the buffer amplifier.

The class-D PA and the buffer amplifier may provide RF power to the leaky surface wave launcher. The leaky surface wave launcher may radiate the leaky wave as a highly directional and selective wave. In some aspects, the matching network may include a capacitor and an inductor. In these and other aspects, the second modulation scheme may include an OOK modulation scheme. In addition, the first modulation scheme may include a BPSK scheme.

In some aspects, the transceiver may include a receiver chain. The receiver chain may include a receiver amplifier stage, a frequency converter, a filter stage, and a digital stage. The receive amplifier stage may amplify the sideband signals received from the leaky surface wave launcher to generate a receive amplified signal. The frequency converter may down convert a frequency of the receive amplified signal to generate a converted signal. The filter stage may generate a filtered signal based on the converted signal. The digital stage may generate a digital signal representative of the filtered signal. At least a portion of the sideband signals may include the digital signal.

The receive chain may include a direct conversion receiver architecture. The receive chain may include lower receiver sensitivity and blocker tolerance which may reduce noise performance and a filter scheme of the receiver.

The receive amplifier stage may generate the second amplified signal at the first frequency. The frequency converter may down convert the first frequency of the amplified signal to a second frequency within a baseband domain to generate the converted signal at the second frequency. The filter stage may generate the filtered signal at the second frequency. The digital stage may generate the digital signal representative of the filtered signal at the second frequency.

The frequency converter may include a first down converter and a second down converter. The first down converter may down convert the frequency of the amplified signal according to a first phase configuration to generate a first intermediate converted signal. The second down converter may down convert the frequency of the amplified signal according to a second phase configuration to generate a second intermediate converted signal. The converted signal may include the first intermediate converted signal and the second intermediate converted signal. In some aspects, the second phase configuration may be out of phase with the first phase configuration.

The filter stage may include a first filter, a second filter, a first converter amplifier, and a second converter amplifier. The first filter may generate a first intermediate filtered signal based on the converted signal. The second filter may generate a second intermediate filtered signal based on the converted signal. The first converter amplifier may amplify an amplitude of the first intermediate filtered signal to generate a first filtered signal. The first converter amplifier may amplify the amplitude based on a gain setting of the first converter amplifier. The second converter amplifier may amplify an amplitude of the second intermediate filtered signal to generate a second filtered signal. The second converter amplifier may amplify the amplitude based on a gain setting of the second converter amplifier. In some aspects, the filtered signal may include the first filtered signal and the second filtered signal.

The digital stage may include a first ADC, a second ADC, and a DSP. The first ADC may generate a first intermediate digital signal representative of at least a portion of the filtered signal. The second ADC may generate a second intermediate digital signal representative of at least a portion of the filtered signal. The DSP may generate the digital signal representative of the first intermediate digital signal and the second intermediate digital signal.

In some aspects, the transceiver may include a transmitter. In these and other aspects, the transmitter may include a PLL transmitter. The transmitter may include a PLL portion to generate a sinusoidal carrier signal. The PLL portion may generate the carrier signal at a resonant frequency of leaky surface wave launcher. The transmitter may also include a switch network electrically coupled to an output of the PLL portion. In some aspects, the sideband signals may include the carrier signal. The PLL portion may generate the carrier signal at the resonant frequency of the leaky surface wave launcher. The switch network may control when the carrier signal is provided to the leaky surface wave launcher based on a data signal.

In some aspects, the transceiver may include a receiver. The receiver may include a low pass filter and a data sampler. The low pass filter may prevent a portion of the sideband signals from propagating to generate a receive filtered signal. The data sampler may recover data from the receive filtered signal to generate a recovered signal. The sideband signals may include the recovered signal. In some aspects, the low pass filter may filter out high frequency portions of the sideband signals.

In some aspects, the probe (e.g., a wireless probe) may perform verification tests (e.g., lab tests) of a package under test. The probe may include a leaky surface wave launcher, a transceiver, and a flex cable. The probe may permit contactless probing of the package under test.

The probe may include a leaky surface wave launcher for NFC coupling and a transceiver. The leaky surface wave launcher may wirelessly provide sideband signals to and wirelessly receive the sideband signals from the package under test. The package under test may be physically positioned in a separate package as the probe. The transceiver may be electrically coupled to the leaky surface wave launcher. The transceiver may process the sideband signals received by the leaky surface wave launcher. The transceiver may generate the sideband signals for wireless transmission by the leaky surface wave launcher. The probe may be configured to be placed physically proximate the package under test to perform test operations of the package under test using the sideband signals transmitted and received wirelessly.

In some aspects, the probe may include a flex cable. The flex cable may electrically couple the transceiver to an external device. In these and other aspects, the leaky surface wave launcher may include a monopole antenna element. In other aspects, the leaky surface wave launcher may include a dipole antenna element.

In some aspects, the probe transceiver may perform switching operations using a digital signal to modulate a carrier signal. In these and other aspects, the probe transceiver may directly down convert the sideband signals received from the via. In some aspects, the probe transceiver may include a PLL transmitter. The probe transmitter may generate a carrier signal at a resonant frequency of the leaky surface wave launcher.

In some aspects, a HVM test system may operate as a bi-directional communicator between a SPA and an EAA. In these and other aspects, the EAA may be vertically placed in an opening (e.g., a cavity) defined by a test socket. The SPA may also be vertically placed in the opening. In some aspects, the HVM test system may include a socket lid. The socket lid may include the EAA. The EAA may include the leaky surface wave launcher. The socket lid may be configured to be placed in the opening defined by the test socket either by hand or by a machine.

The HVM test system may include a test device that defines the opening. The opening may be configured to receive a package under test. The test device may include an EAA. The EAA may include a first leaky surface wave launcher and a first transceiver. The first leaky surface wave launcher may perform NFC coupling. The first leaky surface wave launcher may wirelessly provide sideband signals to and wirelessly receive the sideband signals from a SPA. The SPA may be physically positioned in a separate package as the EAA. The first transceiver may be electrically coupled to the first leaky surface wave launcher. The first transceiver may process the sideband signals received by the first leaky surface wave launcher. The first transceiver may generate the sideband signals for wireless transmission by the first leaky surface wave launcher.

The SPA may be configured to electrically couple to the package under test. In addition, the SPA may be configured to be placed in the opening physically proximate the EAA to perform test operations of the package under test using the sideband signals. The SPA may include a second leaky surface wave launcher and a second transceiver. The second leaky surface wave launcher may perform NFC coupling. The second leaky surface wave launcher may wirelessly provide sideband signals to and wirelessly receive the sideband signals from the EAA. The second transceiver may be electrically coupled to the second leaky surface wave launcher. The second transceiver may process the sideband signals received by the second leaky surface wave launcher. The second transceiver may generate the sideband signals for wireless transmission by the second leaky surface wave launcher.

In some aspects, the HVM system may include a flex cable. The flex cable may electrically couple the first transceiver to an external device. In these and other aspects, the first leaky surface wave launcher and the second leaky surface wave launcher may include monopole antenna elements. In other aspects, the first leaky surface wave launcher and the second leaky surface wave launcher may include dipole antenna elements.

The first transceiver and the second transceiver may perform switching operations using a digital signal to modulate a carrier signal. The first transceiver and the second transceiver may directly down convert the sideband signals received from the corresponding leaky surface wave launchers.

The first transceiver and the second transceiver may include a PLL transmitter. The PLL transmitter may generate a carrier signal at a resonant frequency of the corresponding leaky surface wave launcher. In some aspects, the first leaky surface wave launcher and the second leaky surface wave launcher may be configured as edge couplers. The first leaky surface wave launcher and the second leaky surface wave launcher may perform the NFC coupling via edges of the EAA and SPA.

In some aspects, the test device may include a test socket that defines the opening and includes the EAA. In these and other aspects, the HVM test system may include a test socket lid. The test socket lid may be configured to be placed in at least a portion of the opening and including the EAA. In some aspects, the test socket lid may be placed in the opening by hand. In other aspects, the test socket lid may be configured to be placed in the opening by a machine. For example, the test socket lid may include a pedestal mechanically coupled to a pneumatic machine configured to manipulate the test socket lid.

A HVM test system may include a test socket, an EAA, a cable, and a mother board. The test socket may define an opening. The opening may be configured to receive a package under test. The test socket may include vias electrically coupled to the package under test when the package under test is physically positioned within the opening. The EAA may be physically positioned on a surface of the test socket.

The EAA may include a first leaky surface wave launcher and a first transceiver. The first leaky surface wave launcher may perform NFC coupling. The first leaky surface wave launcher may wirelessly provide sideband signals to and wirelessly receive the sideband signals from a corresponding integrated circuit physically positioned within the package under test. The first transceiver may be electrically coupled to the first leaky surface wave launcher. The first transceiver may process the sideband signals received by the first leaky surface wave launcher. The first transceiver may generate the sideband signals for wireless transmission by the first leaky surface wave launcher. The mother board may be electrically coupled to the EAA via the cable. In addition, the mother board may be electrically coupled to each of the vias. The motherboard may provide the sideband signals to the EAA through the cable. In addition, the motherboard may provide the sideband signals to the package under test through the vias.

In some aspects, during operation, the corresponding integrated circuit may be placed physically proximate the corresponding EAA to perform test operations of at least a portion of the package under test using the sideband signals. The corresponding integrated circuit may include a second leaky surface wave launcher and a second transceiver. The second leaky surface wave launcher may perform NFC coupling. The second leaky surface wave launcher may wirelessly provide sideband signals to and wirelessly receive the sideband signals from the corresponding EAA. The second transceiver may be electrically coupled to the second leaky surface wave launcher. The second transceiver may process the sideband signals received by the second leaky surface wave launcher. The second transceiver may generate the sideband signals for wireless transmission by the second leaky surface wave launcher.

In some aspects, the first leaky surface wave launcher and the second leaky surface wave launcher may include monopole antenna elements. In other aspects, the first leaky surface wave launcher and the second leaky surface wave launcher may include dipole antenna elements.

In some aspects, the first transceiver and the second transceiver may perform switching operations using a digital signal to modulate a carrier signal. In these and other aspects, the first transceiver and the second transceiver may directly down convert the sideband signals received from the corresponding surface leaky wave launchers. In some aspects, the first transceiver and the second transceiver may include PLL transmitters that generate carrier signals at resonant frequencies of the corresponding leaky surface wave launcher.

In some aspects, the first leaky surface wave launcher and the second leaky surface wave launcher may be configured as edge couplers to perform NFC coupling through edges of the EAA and the SPA.

In the following, various aspects of the present disclosure will be illustrated:

Example 1 may include a package substrate including: a circuit configured to perform engineering tests and end-user operations using sideband signals; a leaky surface wave launcher for near field wireless communication, the leaky surface wave launcher including: a via electrically coupled to the circuit, the via configured to provide the sideband signals to and receive the sideband signals from the circuit; and a strip line electrically coupled to the via, the strip line configured to be excited by the sideband signals to wirelessly couple the leaky surface wave launcher with an external device, wherein the strip line and the via are unbalanced such that the strip line generates a leaky wave that propagates at least a portion of the package substrate and an environment proximate the package substrate.

Example 2 may include the package substrate of example 2, wherein the strip line generates the leaky wave in the environment proximate the package substrate in a direction normal a surface of the package substrate.

Example 3 may include the package substrate of any of examples 1-2, wherein the leaky surface wave launcher is configured as an edge coupler to perform the near field wireless techniques through an edge of the package substrate.

Example 4 may include the package substrate of any of examples 1-3, wherein the leaky wave decays within the environment proximate the package substrate based on an attenuation coefficient determined according to:

$$\alpha \approx 2\pi k \left(\frac{\mu_d}{\mu_0} - \frac{\varepsilon_d}{\varepsilon_0}\right)\frac{t}{\lambda}$$

wherein k represents a Rician factor, $\mu_d$ represents a permeability of the package substrate, $\mu_0$ represents a permeability of a vacuum, $\varepsilon_d$ represents a permittivity of the package substrate, $\varepsilon_0$ represents a permittivity of a vacuum, t represents a thickness of the package substrate, and $\lambda$ represents a wavelength of the sideband signals in a vacuum Example 5 may include the package substrate of any of examples 1-4 further including a ground layer configured to electrically ground the leaky surface wave launcher, wherein the portion of the package substrate that the leaky wave propagates is proximate at least a portion of the ground layer.

Example 6 may include the package substrate of any of examples 1-5, wherein the leaky surface wave launcher includes a first leaky surface wave launcher, the leaky wave includes a first leaky wave, and the external device includes a probe, the probe including: a second leaky surface wave launcher for near field wireless communication, the second leaky surface wave launcher including: a probe transceiver configured to generate and receive the sideband signals; a probe via electrically coupled to the probe transceiver, the probe via configured to provide the sideband signals to and receive the sideband signals from the probe transceiver; and a probe strip line electrically coupled to the probe via, the probe strip line configured to be excited by the sideband signals to wirelessly couple the first leaky surface wave launcher with the second leaky surface wave launcher, wherein the probe via and the probe strip line are unbalanced such that the probe strip line generates a second leaky wave that propagates an environment proximate the probe.

Example 7 may include the package substrate of any of examples 1-6, wherein the leaky surface wave launcher includes a monopole antenna element.

Example 8 may include the package substrate of any of examples 1-2, wherein the via includes a first via configured to provide a negative portion of the sideband signals, the strip line includes a first strip line configured to be excited by the negative portion of the sideband signals, and the leaky surface wave launcher further includes: a second via electrically coupled to the circuit, the second via configured to provide a positive portion of the sideband signals to and receive the positive portion of the sideband signals from the circuit; and a second strip line electrically coupled to the second via, the second strip line configured to be excited by the positive portion of the sideband signals, wherein the first strip line is excited by the negative portion and the second strip line is excited by the positive portion to wirelessly couple the leaky surface wave launcher with the external device, wherein the first strip line and the second strip line generate the leaky wave.

Example 9 may include the package substrate of example 8, wherein the leaky surface wave launcher includes a first leaky surface wave launcher, the leaky wave includes a first leaky wave, and the external device includes a probe, the probe including: a second leaky surface wave launcher for near field wireless communication, the second leaky surface wave launcher including: a probe transceiver configured to generate and receive the sideband signals; a third via electrically coupled to the probe transceiver, the third via configured to provide the negative portion of the sideband signals to and receive the negative portion of the sideband signals from the probe transceiver; a third strip line electrically coupled to the third via, the third strip line configured to be excited by the negative portion of the sideband signals; a fourth via electrically coupled to the probe transceiver, the fourth via configured to provide the positive portion of the sideband signals to and receive the positive portion of the sideband signals from the probe transceiver; and a fourth strip line electrically coupled to the fourth via, the fourth strip line configured to be excited by the positive portion of the sideband signals, wherein the third strip line is excited by the negative portion and the fourth strip line is excited by the positive portion to wirelessly couple the second leaky surface wave launcher with the first leaky surface wave launcher, wherein the third strip line and the fourth strip line generate a second leaky wave that propagates at least a portion of the package substrate and an environment proximate the probe.

Example 10 may include the package substrate of any of examples 8 and 9, wherein the leaky surface wave launcher includes a dipole antenna element.

Example 11 may include the package substrate of any of examples 1-10, wherein the leaky wave includes a substantially spherical mode and includes at least one of a TE mode and a TM mode.

Example 12 may include the package substrate of any of examples 6 and 9, wherein the first leaky surface wave launcher and the second leaky surface wave launcher are physically positioned so as to mirror each other.

Example 13 may include the package substrate of any of examples 1-12, wherein the strip line includes an open stub electrically coupled to the via.

Example 14 may include the package substrate of any of examples 1-13, wherein physical dimensions of the strip line are based on a wavelength of the sideband signals.

Example 15 may include the package substrate of any of examples 1-14, wherein the circuit includes a transceiver electrically coupled between a portion of the circuit and the leaky surface wave launcher, the transceiver configured to process the sideband signals for use by the portion of the circuit and wireless transmission by the leaky surface wave launcher.

Example 16 may include the package substrate of example 15, wherein the transceiver is configured to perform switching operations using a digital signal to modulate a carrier signal.

Example 17 may include the package substrate of any of examples 15 and 16, wherein the transceiver is configured to directly down convert the sideband signals received from the via.

Example 18 may include the package substrate of any of examples 15-17, wherein the transceiver includes a transmitter chain including: a modulator stage configured to generate a modulated signal according to a first modulation scheme based on a carrier signal and a second modulation scheme; a transmit amplifier stage configured to amplify an amplitude of the modulated signal based on a gain setting of the transmit amplifier stage to generate a transmit amplified signal; a matching network configured to: generate a matched signal based on the transmit amplified signal, the matched signal generated to match an impedance of the circuit and the leaky surface wave launcher; and provide the matched signal to the strip line, wherein at least a portion of the sideband signals include the matched signal and the strip line generates the leaky wave based on the matched signal.

Example 19 may include the package substrate of example 18, wherein the carrier signal is at a first frequency within a RF domain and wherein: the modulator stage is configured to generate the modulated signal at the first frequency; the transmit amplifier is configured to generate the transmit amplified signal at the first frequency; the matching network is configured to generate the matched signal at the first frequency; and the leaky surface wave launcher is configured to wirelessly transmit the sideband signals including the matching signal at the first frequency.

Example 20 may include the package substrate of any of examples 18 and 19, wherein the carrier signal includes data and the modulator stage includes: an and gate configured to gate the carrier signal and the first signal to generate a gate signal according to the first modulation scheme; an inverter configured to generate an inverted signal based on the gate signal; and a multiplexer configured to multiplex the gate signal and the inverted signal based on a second signal modulated according to the second modulation scheme and the second signal including data to generate the modulated signal including the data of the carrier signal and the data of the second signal.

Example 21 may include the package substrate of any of examples 18-20, wherein transmit amplifier includes: a class-D PA configured to amplify the amplitude of the modulation signal based on a gain setting of the class-D PA to generate an intermediate signal; and a buffer amplifier configured to amplify the amplitude the of the intermediate signal based on a gain setting of the buffer amplifier to generate the transmit amplified signal, wherein the gain setting of the transmit amplifier stage includes the gain setting of the class-D PA and the gain setting of the buffer amplifier.

Example 22 may include the package substrate of any of examples 18-21, wherein the matching network includes a capacitor and an inductor.

Example 23 may include the package substrate of any of examples 18-22, wherein the second modulation scheme includes an OOK modulation scheme.

Example 24 may include the package substrate of any of examples 18-23, wherein the first modulation scheme includes a BPSK modulation scheme.

Example 25 may include the package substrate of any of examples 15-24, wherein the transceiver includes a receiver chain including: a receive amplifier stage configured to amplify the sideband signals received from the leaky surface wave launcher to generate a receive amplified signal; a frequency converter configured to down convert a frequency of the receive amplified signal to generate a converted signal; a filter stage configured to generate a filtered signal based on the converted signal; and a digital stage configured to generate a digital signal representative of the filtered signal, wherein at least a portion of the sideband signals include the digital signal.

Example 26 may include the package substrate of example 25, wherein: the receive element is configured to wirelessly receive a matched signal at a first frequency within a RF domain; the receive amplifier stage is configured to generate the receive amplified signal at the first frequency; the frequency converter is configured to down convert the first frequency of the amplified signal to a second frequency within a baseband domain to generate the converted signal at the second frequency; the filter stage is configured to generate the filtered signal at the second frequency; and the digital stage is configured to generate the digital signal representative of the filtered signal at the second frequency.

Example 27 may include the package substrate of any of examples 15-26, wherein the frequency converter includes: a first down converter configured to down convert the frequency of the amplified signal according to a first phase configuration of the first down converter to generate a first intermediate converted signal; and a second down converter configured to down convert the frequency of the amplified signal according to a second phase configuration of the second down converter to generate a second intermediate converted signal, wherein the converted signal includes the first intermediate converted signal and the second intermediate converted signal and the second phase configuration is out of phase with the first phase configuration.

Example 28 may include the package substrate of any of examples 15-27, wherein the filter stage includes: a first filter configured to generate a first intermediate filtered signal based on the converted signal; a second filter configured to generate a second intermediate filtered signal based on the converted signal; a first converter amplifier configured to amplify an amplitude of the first intermediate filtered signal based on a gain setting of the first converter amplifier to generate a first filtered signal; and a second converter amplifier configured to amplify an amplitude of the second intermediate filtered signal based on a gain setting of the second converter amplifier to generate a second filtered signal, wherein the filtered signal includes the first filtered signal and the second filtered signal.

Example 29 may include the package substrate of any of examples 15-28, wherein the digital stage includes: a first ADC configured to generate a first intermediate digital signal representative of at least a portion of the filtered signal; a second ADC configured to generate a second intermediate digital signal representative of at least a portion of the filtered signal; and a DSP configured to generate the digital signal representative of the first intermediate digital signal and the second intermediate digital signal.

Example 30 may include the package substrate of example 15, wherein the transceiver includes a PLL transmitter configured to generate a carrier signal at a resonant frequency of the leaky surface wave launcher, wherein the sideband signals include the carrier signal.

Example 31 may include the package substrate of example 30, wherein the PLL transmitter includes: a PLL portion configured to generate the carrier signal at the resonant frequency of the leaky surface wave launcher; and a switch network configured to control when the carrier signal is provided to the leaky surface wave launcher based on a data signal, wherein the sideband signals include the carrier signal.

Example 32 may include the package substrate of any of examples 15, 30, and 31, wherein the transceiver includes a receiver, the receiver including: a low pass filter configured to prevent a portion of the sideband signals from propagating to generate a receive filtered signal; and a data sampler configured to recover data from the receive filtered signal to generate a recovered signal, wherein the sideband signals include the recovered signal.

Example 33 may include a probe for wireless lab testing, the probe including: a leaky surface wave launcher for near field wireless communication, the leaky surface wave launcher configured to wirelessly provide sideband signals to and wirelessly receive the sideband signals from a circuit under test physically positioned in a separate package as the probe; and a transceiver electrically coupled to the leaky surface wave launcher, the transceiver configured to: process the sideband signals received by the leaky surface wave launcher; and generate the sideband signals for wireless transmission by the leaky surface wave launcher, the probe configured to be placed physically proximate the circuit under test to perform test operations of the circuit under test using the sideband signals transmitted and received wirelessly.

Example 34 may include the probe of example 33 further including a flex cable configured to electrically couple the transceiver to an external device.

Example 35 may include the probe of any of examples 33 and 34, wherein the leaky surface wave launcher includes a monopole antenna element.

Example 36 may include the probe of any of examples 33 and 34, wherein the leaky surface wave launcher includes a dipole antenna element.

Example 37 may include the probe of any of examples 32-36, wherein the transceiver is configured to perform switching operations using a digital signal to modulate a carrier signal.

Example 38 may include the probe of any of examples 32-37, wherein the transceiver is configured to directly down convert the sideband signals received from the via.

Example 39 may include the probe of any of examples 32-36, wherein the transceiver includes PLL transmitter configured to generate a carrier signal at a resonant frequency of the leaky surface wave launcher, wherein the sideband signals include the carrier signal.

Example 40 may include a HVM test system including a test device defining an opening configured to receive a package under test, the test device including an EAA including: a first leaky surface wave launcher for near field wireless communication, the first leaky surface wave launcher configured to wirelessly provide sideband signals to and wirelessly receive the sideband signals from a silicon package agent physically positioned in a separate package as the EAA; and a first transceiver electrically coupled to the first leaky surface wave launcher, the first transceiver configured to: process the sideband signals received by the first leaky surface wave launcher; and generate the sideband signals for wireless transmission by the first leaky surface wave launcher.

Example 41 may include the HVM test system of example 40, wherein the silicon package agent is configured to electrically couple to the package under test and to be placed physically proximate the EAA to perform test operations of the package under test using the sideband signals, the silicon package agent including: a second leaky surface wave launcher for near field wireless communication, the second leaky surface wave launcher configured to wirelessly provide sideband signals to and wirelessly receive the sideband signals from the EAA; a second transceiver electrically coupled to the second leaky surface wave launcher, the second transceiver configured to: process the sideband signals received by the second leaky surface wave launcher; and generate the sideband signals for wireless transmission by the second leaky surface wave launcher.

Example 42 may include the HVM test system of any of examples 40 and 41 further including a flex cable configured to electrically couple the first transceiver to an external device.

Example 43 may include the HVM test system of any of examples 40-42, wherein the first leaky surface wave launcher includes a monopole antenna element.

Example 44 may include the HVM test system of any of examples 40-42, wherein the first leaky surface wave launcher includes a dipole antenna element.

Example 45 may include the HVM test system of any of examples 40-44, wherein the first transceiver is configured to perform switching operations using a digital signal to modulate a carrier signal.

Example 46 may include the HVM test system of any of examples 40-45, wherein the first transceiver is configured to directly down convert the sideband signals received from the via.

Example 47 may include the HVM test system of any of examples 40-44, wherein the first transceiver includes a PLL transmitter configured to generate a carrier signal at a resonant frequency of the leaky surface wave launcher, wherein the sideband signals include the carrier signal.

Example 48 may include the HVM test system of any of examples 40-47, wherein the first leaky surface wave launcher is configured as an edge coupler to perform the near field wireless techniques through an edge of the EAA.

Example 49 may include the HVM test system of any of examples 41-48, wherein the second leaky surface wave launcher is configured as an edge coupler to perform the near field wireless techniques through an edge of the silicon package agent.

Example 50 may include the HVM test system of any of examples 40-49, wherein the test device includes a test socket that defines the opening and includes the EAA.

Example 51 may include the HVM test system of any of examples 40-49, wherein the test device includes: a test socket that defines the opening; and a test socket lid configured to be placed in at least a portion of the opening and including the EAA.

Example 52 may include the HVM test system of example 51, wherein the test socket lid is configured to be placed in the opening by hand.

Example 53 may include the HVM test system of example 51, wherein the test socket lid is configured to be placed in the opening by a machine.

Example 54 may include a HVM test system, the HVM test system including: a test socket that defines an opening configured to receive a package under test and including a plurality of vias electrically coupled to the package under test when physically positioned within the opening; an EAA physically positioned on a surface of the test socket, the EAA including: a first leaky surface wave launcher for near field wireless communication, the first leaky surface wave launcher configured to wirelessly provide sideband signals to and wirelessly receive the sideband signals from a corresponding integrated circuit physically positioned within the package under test; and a first transceiver electrically coupled to the first leaky surface wave launcher, the first transceiver configured to: process the sideband signals received by the first leaky surface wave launcher; and generate the sideband signals for wireless transmission by the first leaky surface wave launcher; and a mother board electrically coupled to: the EAA via a cable; and each via of the plurality of vias, the motherboard configured to provide the sideband signals to the EAAs through the cable and to the package under test through the plurality of vias.

Example 55 may include the HVM test system of example 54, wherein during operation, the corresponding integrated circuit is placed physically proximate the corresponding EAA to perform test operations of at least a portion of the package under test using the sideband signals, the corresponding integrated circuit including: a second leaky surface wave launcher for near field wireless communication, the second leaky surface wave launcher configured to wirelessly provide sideband signals to and wirelessly receive the sideband signals from the corresponding EAA; and a second transceiver electrically coupled to the second leaky surface wave launcher, the second transceiver configured to: process the sideband signals received by the second leaky surface wave launcher; and generate the sideband signals for wireless transmission by the second leaky surface wave launcher.

Example 56 may include the HVM test system of any of examples 53 and 54, wherein the first leaky surface wave launcher includes a monopole antenna element.

Example 57 may include the HVM test system of any of examples 53 and 54, wherein the first leaky surface wave launcher includes a dipole antenna element.

Example 58 may include the HVM test system of any of examples 53-57, wherein the first transceiver is configured to perform switching operations using a digital signal to modulate a carrier signal.

Example 59 may include the HVM test system of any of examples 53-58, wherein the first transceiver is configured to directly down convert the sideband signals received from the via.

Example 60 may include the HVM test system of any of examples 53-59, wherein the transceiver includes a PLL transmitter configured to generate a carrier signal at a resonant frequency of the leaky surface wave launcher, wherein the sideband signals include the carrier signal.

Example 61 may include the HVM test system of any of examples 53-60, wherein the first leaky surface wave launcher is configured as an edge coupler to perform the near field wireless techniques through an edge of the EAA.

Example 62 may include the HVM test system of any of examples 54-61, wherein the second leaky surface wave launcher is configured as an edge coupler to perform the near field wireless techniques through an edge of the silicon package agent.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

What is claimed is:

1. A package substrate comprising:
a circuit configured to perform engineering tests and end-user operations using sideband signals;
   a leaky surface wave launcher for near field wireless communication, the leaky surface wave launcher comprising:
      a via electrically coupled to the circuit, the via configured to provide the sideband signals to and receive the sideband signals from the circuit; and
      a strip line electrically coupled to the via, the strip line configured to be excited by the sideband signals to wirelessly couple the leaky surface wave launcher with an external device, wherein the strip line and the via are unbalanced such that the strip line generates a leaky wave that propagates at least a portion of the package substrate and an environment proximate the package substrate;
wherein the circuit comprises a transceiver electrically coupled between a portion of the circuit and the leaky surface wave launcher, the transceiver configured to process the sideband signals for use by the portion of the circuit and wireless transmission by the leaky surface wave launcher.

2. The package substrate of claim 1, wherein the leaky surface wave launcher is configured as an edge coupler to perform the near field wireless techniques through an edge of the package substrate.

3. The package substrate of claim 1, wherein the leaky surface wave launcher comprises a first leaky surface wave launcher, the leaky wave comprises a first leaky wave, and the external device comprises a probe, the probe comprising:
   a second leaky surface wave launcher for near field wireless communication, the second leaky surface wave launcher comprising:
      a probe transceiver configured to generate and receive the sideband signals;
      a probe via electrically coupled to the probe transceiver, the probe via configured to provide the sideband signals to and receive the sideband signals from the probe transceiver; and
      a probe strip line electrically coupled to the probe via, the probe strip line configured to be excited by the sideband signals to wirelessly couple the first leaky surface wave launcher with the second leaky surface wave launcher, wherein the probe via and the probe strip line are unbalanced such that the probe strip line generates a second leaky wave that propagates an environment proximate the probe.

4. The package substrate of claim 3, wherein the first leaky surface wave launcher and the second leaky surface wave launcher are physically positioned so as to mirror each other.

5. The package substrate of claim 1, wherein the via comprises a first via configured to provide a negative portion of the sideband signals, the strip line comprises a first strip line configured to be excited by the negative portion of the sideband signals, and the leaky surface wave launcher further comprises:
   a second via electrically coupled to the circuit, the second via configured to provide a positive portion of the sideband signals to and receive the positive portion of the sideband signals from the circuit; and
   a second strip line electrically coupled to the second via, the second strip line configured to be excited by the positive portion of the sideband signals, wherein the first strip line is excited by the negative portion and the second strip line is excited by the positive portion to wirelessly couple the leaky surface wave launcher with the external device, wherein the first strip line and the second strip line generate the leaky wave.

6. The package substrate of claim 1, wherein the transceiver comprises a transmitter chain comprising:
   a modulator stage configured to generate a modulated signal according to a first modulation scheme based on a carrier signal and a second modulation scheme;
   a transmit amplifier stage configured to amplify an amplitude of the modulated signal based on a gain setting of the transmit amplifier stage to generate a transmit amplified signal;
   a matching network configured to:
   generate a matched signal based on the transmit amplified signal, the matched signal generated to match an impedance of the circuit and the leaky surface wave launcher; and
   provide the matched signal to the strip line, wherein at least a portion of the sideband signals comprise the matched signal and the strip line generates the leaky wave based on the matched signal.

7. The package substrate of claim 6, wherein the carrier signal is at a first frequency within a RF domain and wherein: the modulator stage is configured to generate the modulated signal at the first frequency; the transmit amplifier is configured to generate the transmit amplified signal at the first frequency; the matching network is configured to generate the matched signal at the first frequency; and the leaky surface wave launcher is configured to wirelessly transmit the sideband signals including the matching signal at the first frequency.

8. The package substrate of claim 7, wherein the carrier signal includes data and the modulator stage includes: an and gate configured to gate the carrier signal and the first signal to generate a gate signal according to the first modulation scheme; an inverter configured to generate an inverted signal based on the gate signal; and a multiplexer configured to multiplex the gate signal and the inverted signal based on a second signal modulated according to the second modulation scheme and the second signal including data to generate the modulated signal including the data of the carrier signal and the data of the second signal.

9. The package substrate of claim 1, wherein the transceiver comprises a receiver chain comprising:
   a receive amplifier stage configured to amplify the sideband signals received from the leaky surface wave launcher to generate a receive amplified signal;
   a frequency converter configured to down convert a frequency of the receive amplified signal to generate a converted signal;
   a filter stage configured to generate a filtered signal based on the converted signal; and
   a digital stage configured to generate a digital signal representative of the filtered signal, wherein at least a portion of the sideband signals comprise the digital signal.

10. The package substrate of claim 1, wherein the transceiver comprises a phase lock loop (PLL) transmitter configured to generate a carrier signal at a resonant frequency of the leaky surface wave launcher, wherein the sideband signals comprise the carrier signal.

11. The package substrate of claim 1, wherein the transceiver comprises a receiver, the receiver comprising:

a low pass filter configured to prevent a portion of the sideband signals from propagating to generate a receive filtered signal; and a data sampler configured to recover data from the receive filtered signal to generate a recovered signal, wherein the sideband signals comprise the recovered signal.

12. The package substrate of claim 1, wherein the strip line generates the leaky wave in the environment proximate the package substrate in a direction normal a surface of the package substrate.

13. The package substrate of claim 1, wherein the leaky wave decays within the environment proximate the package substrate based on an attenuation coefficient determined according to:

$$\alpha \approx 2\pi k(\mu_d/\mu_0 - \varepsilon_d/\varepsilon_0)t/\lambda$$

wherein k represents a Rician factor, $\mu_d$ represents a permeability of the package substrate, $\mu_0$ represents a permeability of a vacuum, $\varepsilon_d$ represents a permittivity of the package substrate, $\varepsilon_0$ represents a permittivity of a vacuum, t represents a thickness of the package substrate, and $\lambda$ represents a wavelength of the sideband signals in a vacuum.

14. The package substrate of claim 1, further comprising a ground layer configured to electrically ground the leaky surface wave launcher, wherein the portion of the package substrate that the leaky wave propagates is proximate at least a portion of the ground layer.

15. The package substrate of claim 1, wherein the leaky wave comprises a substantially spherical mode and includes at least one of a TE mode and a TM mode.

16. The package substrate of claim 1, wherein the strip line includes an open stub electrically coupled to the via.

17. The package substrate of claim 1, wherein the transceiver is configured to perform switching operations using a digital signal to modulate a carrier signal.

18. The package substrate of claim 17, wherein the transceiver is configured to directly down convert the sideband signals received from the via.

* * * * *